US010020657B2

(12) United States Patent
Newdoll et al.

(10) Patent No.: US 10,020,657 B2
(45) Date of Patent: *Jul. 10, 2018

(54) POLE-MOUNTED POWER GENERATION SYSTEMS, STRUCTURES AND PROCESSES

(71) Applicant: Accurate Solar Power, LLC, Menlo Park, CA (US)

(72) Inventors: Ronald M. Newdoll, Woodside, CA (US); Argil E. Shaver, II, Menlo Park, CA (US)

(73) Assignee: Newdoll Enterprises LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/275,272

(22) Filed: Sep. 23, 2016

(65) Prior Publication Data

US 2017/0012438 A1 Jan. 12, 2017

Related U.S. Application Data

(63) Continuation of application No. 14/949,611, filed on Nov. 23, 2015, now abandoned, which is a
(Continued)

(51) Int. Cl.
*H01L 31/042* (2014.01)
*H02J 3/38* (2006.01)
(Continued)

(52) U.S. Cl.
CPC ........ *H02J 3/385* (2013.01); *H01L 31/02021* (2013.01); *H01L 31/042* (2013.01);
(Continued)

(58) Field of Classification Search
CPC .... H02M 7/44; H02J 3/38; H02J 3/383; H02J 3/385; H02J 13/0062; H02J 13/0079;
(Continued)

(56) References Cited

U.S. PATENT DOCUMENTS 3,958,171 A 5/1976 Sekino
4,488,791 A 12/1984 Hinchliffe
(Continued)

FOREIGN PATENT DOCUMENTS

AU 2010101396 2/2011
CN 201141544 10/2008
(Continued)

OTHER PUBLICATIONS

"Long Island Power Authority Requirements for Interconnection of New Distributed Generation Units with Capacity of 300kVA", Radial Distribution Lines, (Date Unknown—before Jun. 19, 2006), 1-12.
(Continued)

*Primary Examiner* — Robert Deberadinis
(74) *Attorney, Agent, or Firm* — Michael A. Glenn; Perkins Coie LLP

(57) ABSTRACT

Solar power systems and structures are mountable to a power distribution structure, e.g. a power pole or tower, which supports alternating current (AC) power transmission lines. An exemplary power generation structure is fixedly attached to and extends from the power distribution structure, and comprises a mounting rack. A solar array, comprising at least one solar panel, is affixed to the mounting rack. A DC to AC inverter is connected between the DC outputs of the solar array and the AC power transmission lines. The length of the solar array is generally in alignment with the power distribution structure, and the width of the solar array is greater than half the circumference of the power distribution structure. The mounting rack and solar array may preferably be rotatable, such as based on any of location, time of day, or available light.

26 Claims, 28 Drawing Sheets

Related U.S. Application Data continuation of application No. 13/615,014, filed on Sep. 13, 2012, now Pat. No. 9,196,770, and a continuation-in-part of application No. PCT/US2010/045352, filed on Aug. 12, 2010, and a continuation-in-part of application No. 12/842,864, filed on Jul. 23, 2010, now Pat. No. 8,035,249, which is a continuation of application No. 12/056,235, filed on Mar. 26, 2008, now Pat. No. 7,772,716, said application No. 13/615,014 is a continuation-in-part of application No. 13/250,887, filed on Sep. 30, 2011, now Pat. No. 8,427,009, which is a continuation of application No. 12/842,864, which is a continuation of application No. 12/056,235.

(60) Provisional application No. 61/534,802, filed on Sep. 14, 2011, provisional application No. 61/234,181, filed on Aug. 14, 2009, provisional application No. 60/908,361, filed on Mar. 27, 2007.

(51) Int. Cl.
  *H02J 13/00* (2006.01)
  *H01L 31/02* (2006.01)
  *H02S 50/10* (2014.01)
  *H02M 7/44* (2006.01)
  *H02S 20/32* (2014.01)
  *H02S 40/32* (2014.01)
  *H02J 3/46* (2006.01)

(52) U.S. Cl.
  CPC .............. *H02J 3/383* (2013.01); *H02J 3/386* (2013.01); *H02J 3/46* (2013.01); *H02J 13/0062* (2013.01); *H02J 13/0079* (2013.01); *H02M 7/44* (2013.01); *H02S 20/32* (2014.12); *H02S 40/32* (2014.12); *H02S 50/10* (2014.12); *Y02B 90/2638* (2013.01); *Y02E 10/58* (2013.01); *Y02E 40/72* (2013.01); *Y02E 60/74* (2013.01); *Y04S 10/123* (2013.01); *Y04S 10/30* (2013.01); *Y04S 40/124* (2013.01); *Y10T 307/406* (2015.04)

(58) Field of Classification Search
  CPC ... Y10T 307/406; H01L 31/042; Y02E 10/58; Y02B 90/2638; Y04S 10/123; Y04S 40/124; Y04S 10/30
  See application file for complete search history.

(56) References Cited

U.S. PATENT DOCUMENTS

| | | |
|---|---|---|
| 4,599,685 A | 7/1986 | Hombu et al. |
| 5,706,798 A | 1/1998 | Steinorth |
| 5,742,495 A | 4/1998 | Barone |
| 5,982,253 A | 11/1999 | Perrin et al. |
| 6,153,823 A | 11/2000 | Shiozaki et al. |
| 6,201,180 B1 | 3/2001 | Meyer et al. |
| 6,285,572 B1 | 9/2001 | Onizuka et al. |
| 6,291,762 B1 | 9/2001 | Jan et al. |
| 6,750,391 B2 | 6/2004 | Bower et al. |
| 6,810,339 B2 | 10/2004 | Wills |
| 7,104,064 B2 | 9/2006 | Hon |
| 7,443,052 B2 | 10/2008 | Wendt et al. |
| 7,444,816 B2 | 11/2008 | Hon |
| 7,731,383 B2 | 6/2010 | Myer |
| 7,772,716 B2 | 8/2010 | Shaver |
| 7,866,927 B1 | 1/2011 | Wong |
| 7,994,657 B2 | 8/2011 | Kimball et al. |
| 8,035,249 B2 | 10/2011 | Shaver et al. |
| 9,196,770 B2 * | 11/2015 | Newdoll .............. H01L 31/042 |
| 2002/0066473 A1 | 6/2002 | Levy et al. |
| 2002/0074034 A1 | 6/2002 | Fujisaki et al. |
| 2003/0111103 A1 | 6/2003 | Bower et al. |
| 2003/0177706 A1 | 9/2003 | Ullman |
| 2004/0207366 A1 | 10/2004 | Sung |
| 2004/0261334 A1 | 12/2004 | Liebendorfer et al. |
| 2005/0076563 A1 | 4/2005 | Faris |
| 2006/0103360 A9 | 5/2006 | Cutler et al. |
| 2006/0185727 A1 | 8/2006 | Matan |
| 2006/0266408 A1 | 11/2006 | Horne et al. |
| 2007/0089778 A1 | 4/2007 | Horne et al. |
| 2007/0090653 A1 | 4/2007 | Martelon |
| 2007/0113881 A1 | 5/2007 | Mellott et al. |
| 2007/0221267 A1 | 9/2007 | Fornage |
| 2007/0271006 A1 | 11/2007 | Golden et al. |
| 2008/0149786 A1 | 6/2008 | Bradley |
| 2008/0149791 A1 | 6/2008 | Bradley |
| 2008/0150484 A1 | 6/2008 | Kimball et al. |
| 2008/0169652 A1 | 7/2008 | Green |
| 2008/0238195 A1 | 10/2008 | Shaver, II et al. |
| 2009/0030605 A1 | 1/2009 | Breed |
| 2009/0040750 A1 | 2/2009 | Myer |
| 2009/0078299 A1 | 3/2009 | Cinnamon et al. |
| 2009/0090895 A1 | 4/2009 | Hogan, Jr. |
| 2009/0146501 A1 | 6/2009 | Cyrus |
| 2009/0150005 A1 | 6/2009 | Hader et al. |
| 2009/0160259 A1 | 6/2009 | Naiknaware et al. |
| 2009/0194669 A1 | 8/2009 | Noble et al. |
| 2009/0199846 A1 | 8/2009 | Collins et al. |
| 2009/0266353 A1 | 10/2009 | Lee |
| 2009/0283129 A1 | 11/2009 | Foss |
| 2010/0043851 A1 | 2/2010 | Levy et al. |
| 2010/0205870 A1 | 8/2010 | Cobb |
| 2010/0212093 A1 | 8/2010 | Pak et al. |
| 2010/0237305 A1 | 9/2010 | Miller |
| 2010/0270808 A1 | 10/2010 | Bates et al. |
| 2010/0284737 A1 | 11/2010 | McPheeters |
| 2010/0296285 A1 | 11/2010 | Chemel et al. |
| 2010/0328931 A1 | 12/2010 | Fogerlie |
| 2010/0328932 A1 | 12/2010 | Fogerlie |
| 2011/0005583 A1 | 1/2011 | Thomas |
| 2011/0017256 A1 | 1/2011 | Stevens |
| 2011/0041834 A1 | 2/2011 | Liao |
| 2011/0058664 A1 | 3/2011 | Prax et al. |
| 2011/0073161 A1 | 3/2011 | Scanlon |
| 2011/0085322 A1 | 4/2011 | Myer |
| 2011/0120523 A1 | 5/2011 | Silver |
| 2011/0163222 A1 | 7/2011 | Moser |
| 2011/0192460 A1 | 8/2011 | Tan |
| 2011/0259380 A1 | 10/2011 | Lai |
| 2011/0265840 A1 | 11/2011 | Sela |
| 2012/0187222 A1 | 7/2012 | Galili et al. |

FOREIGN PATENT DOCUMENTS

| | | |
|---|---|---|
| CN | 202362621 | 8/2012 |
| DE | 103 20 347 | 12/2004 |
| EP | 033706 | 9/1989 |
| JP | S59 79579 | 5/1984 |
| JP | 59-150484 | 8/1984 |
| JP | S62 13084 | 1/1987 |
| JP | 9182459 | 7/1997 |
| JP | H10 308523 | 11/1998 |
| JP | 3405035 | 5/2003 |
| JP | 2003-197945 | 7/2003 |
| JP | 2003-199377 | 7/2003 |
| KR | 2009010561 | 1/2009 |
| WO | 2005/076444 | 8/2005 |
| WO | 200622590 | 3/2006 |
| WO | 2006/078685 | 7/2006 |
| WO | 2006071436 | 7/2006 |
| WO | 2006130520 | 12/2006 |
| WO | 2007/106519 | 9/2007 |
| WO | 200845335 | 4/2008 |
| WO | 200880088 | 7/2008 |
| WO | 200888311 | 7/2008 |
| WO | 2008/125915 | 10/2008 |
| WO | 2008/129089 A1 | 10/2008 |
| WO | 2008/144540 | 11/2008 |
| WO | 200938810 | 3/2009 |

(56) References Cited

FOREIGN PATENT DOCUMENTS

| WO | 2009/044982 | 4/2009 |
|---|---|---|
| WO | 2009114730 | 9/2009 |
| WO | 201008927 | 1/2010 |
| WO | 201050993 | 5/2010 |
| WO | 201068706 | 6/2010 |
| WO | 2010102256 | 9/2010 |
| WO | 2010118236 | 10/2010 |
| WO | 2010118503 | 10/2010 |
| WO | 20100123538 | 10/2010 |
| WO | 2011044641 | 4/2011 |

OTHER PUBLICATIONS

"Solar Tracking System", Solazone, solar tracker, retrieved online on Aug. 19, 2011 from url: http://www.solazone.com.au/tracker.htm, 7 pages.

"Welcome to the next phase of solar", enphase Energy Brochure System Overview; retrieved Sep. 13, 2012 online from url: http://enphase.com/producs/microinverters ; copyright 2012, 3 pages.

Clark, et al., "Plug-n-Play, Reliable Power Systems for Nanosatellites", 20th Annual AIAAIUSU Conference on Small Satellites retrieved on May 21, 2008 from website http://ssdl.stanford.edu/ssdl/images/storiesIAA236/A06Fall/ARFC/ssc06-vi-2.pdf.

Orduz, R. et al., "Evaluation Test Results of a New Distributed MPPT Converter", 22nd European Photovoltaic Solar Energy Conference, Sep. 3-7, 2007, Milan, Italy.

Santos, J.L. et al., "Maximum Power Point Tracker for PV Systems", RIO 3—World Climate & Energy Event, Rio de Janiero, Brazil, Dec. 2003, 75-80.

Ton, D. et al., "Summary Report of the DOE High-Tech Inverter Workshop", Jan. 2005, 124 pages.

Walker, G.R et al., "PV String Per-Module Maximum Power Point Enabling Converters;", Proceedings of the Australasian Universities Power Engineering Conference, Christchurch, New Zealand, Oct. 2003, Total of 6 pages.

Xantrex Technology, Inc., , "PV Series Grid Tie Solar Inverters—Three Phase—North America", Accessed at: xantrex.comlweb/id/11/p/1/pt123/product.asp, Feb. 3, 2010, Total of 1 page.

\* cited by examiner

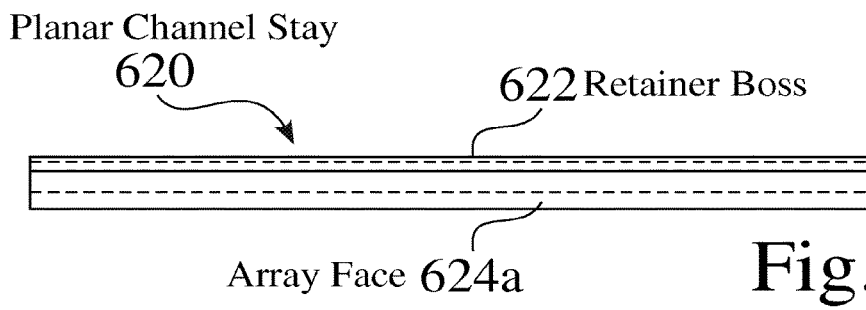
Fig. 15
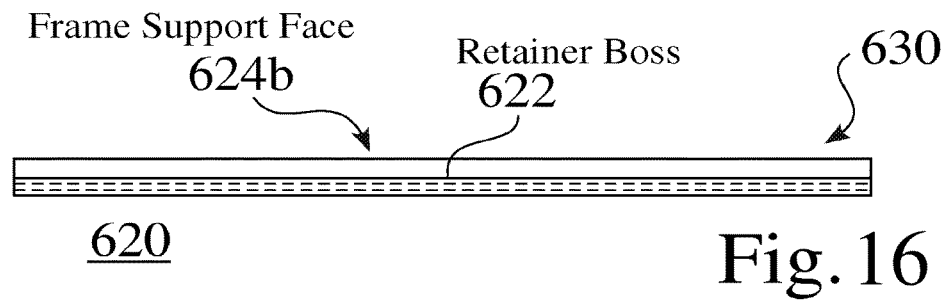
Fig. 16
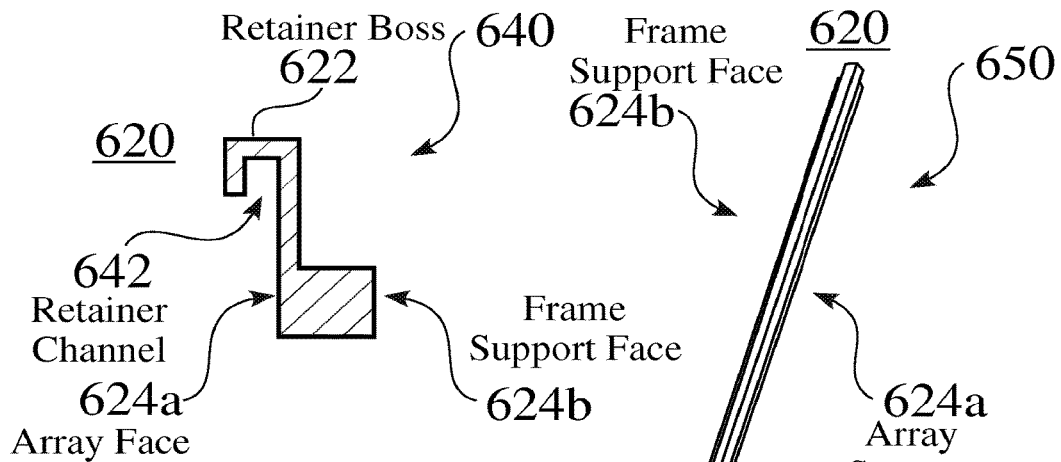
Fig. 17
Fig. 18

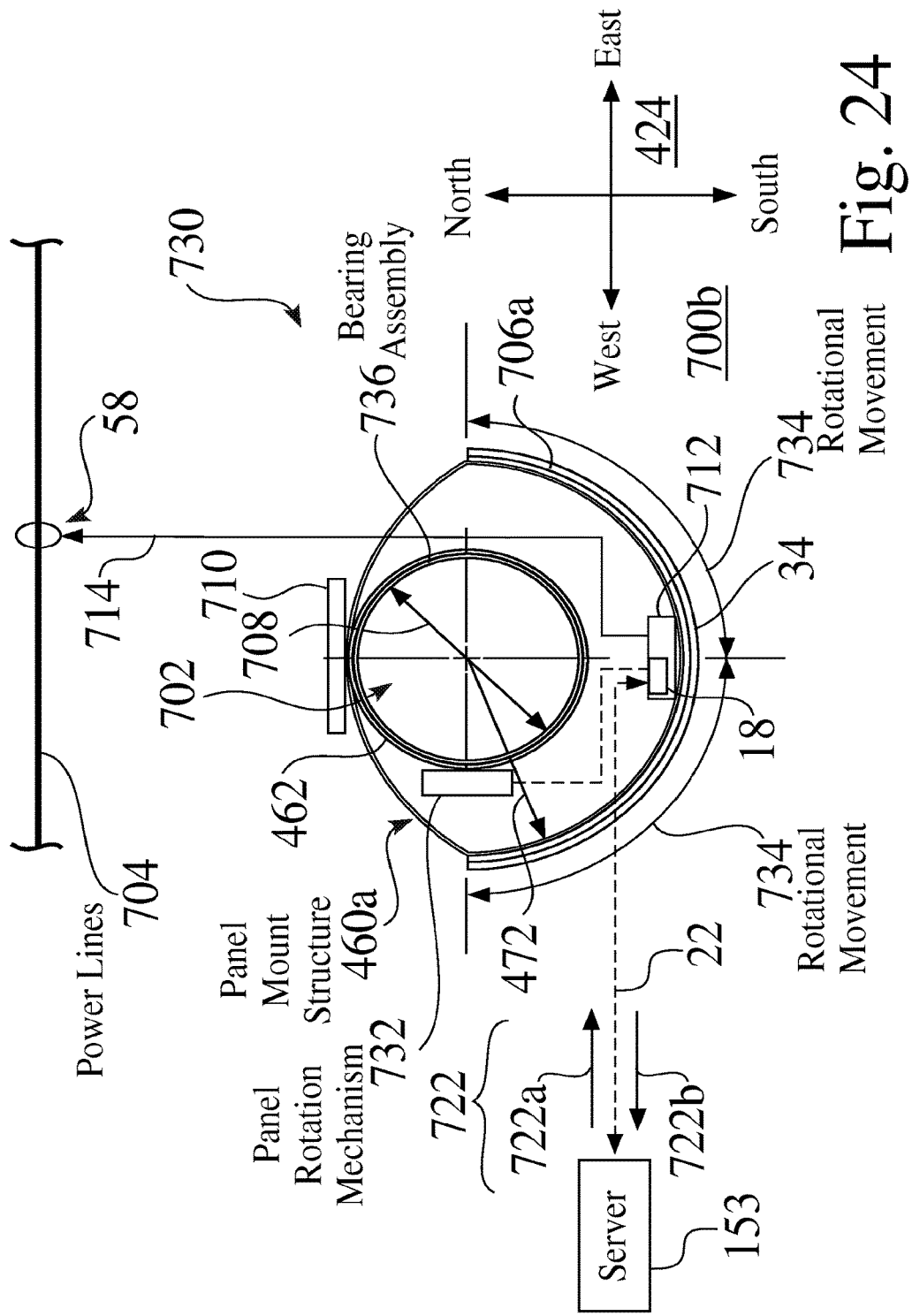

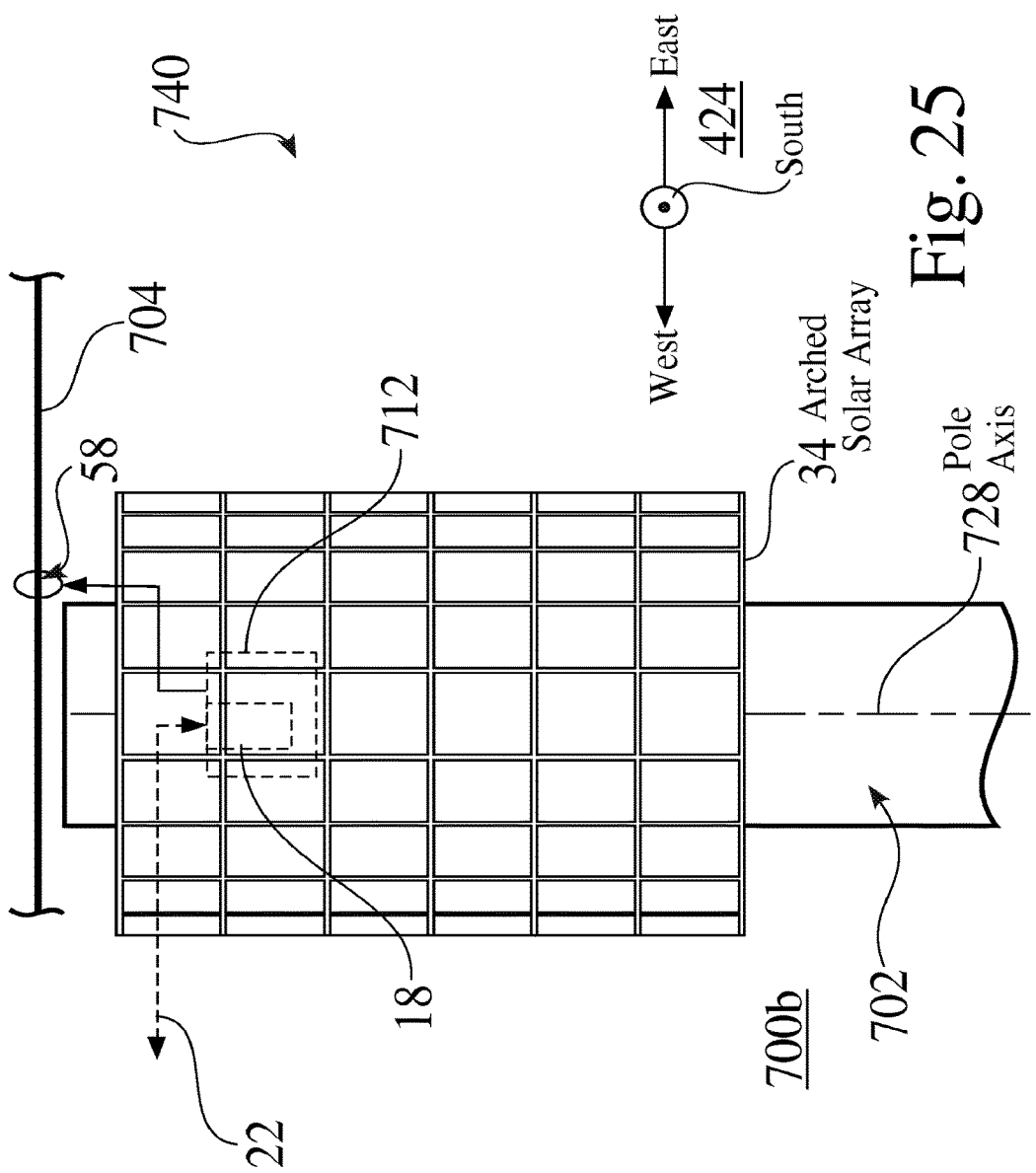

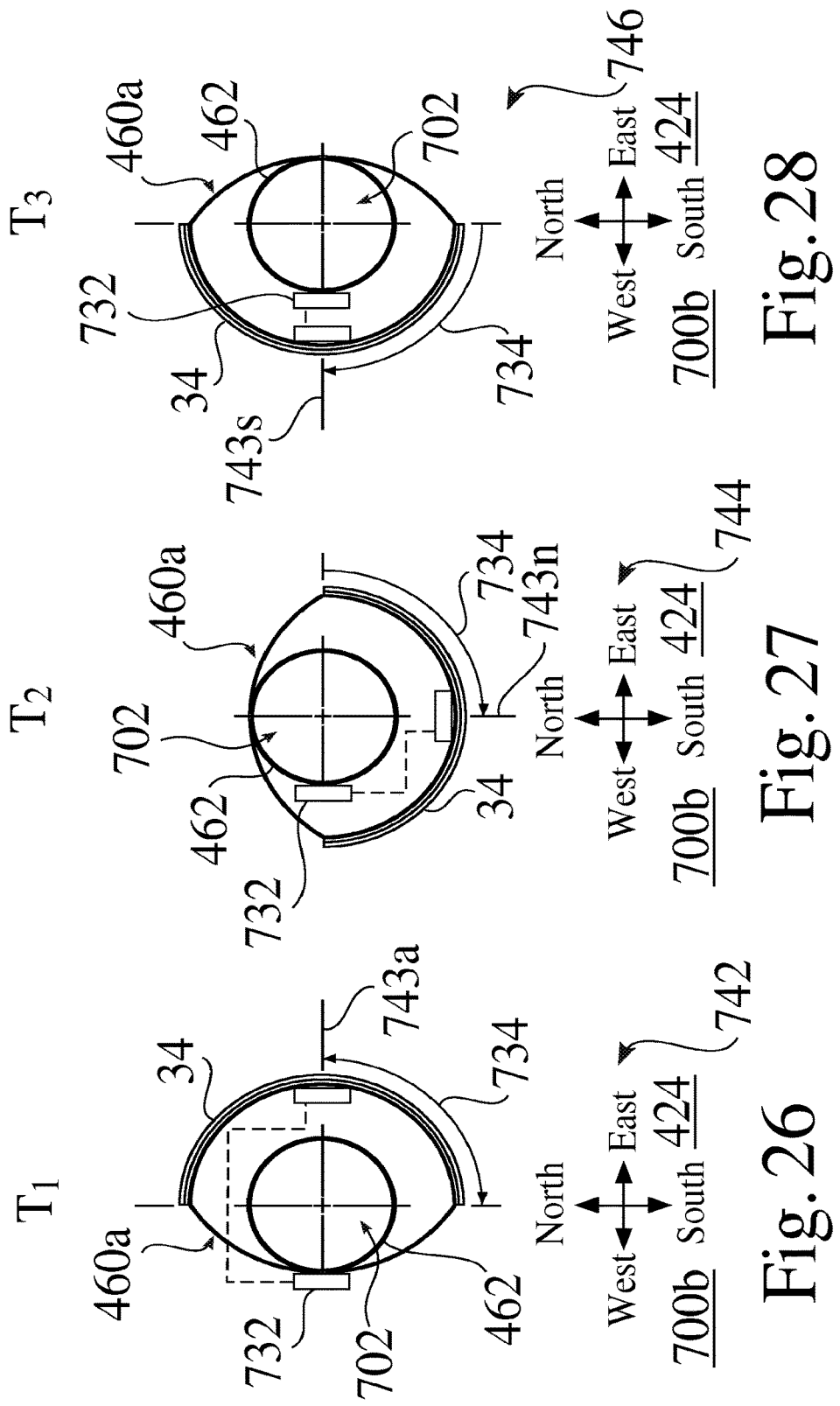

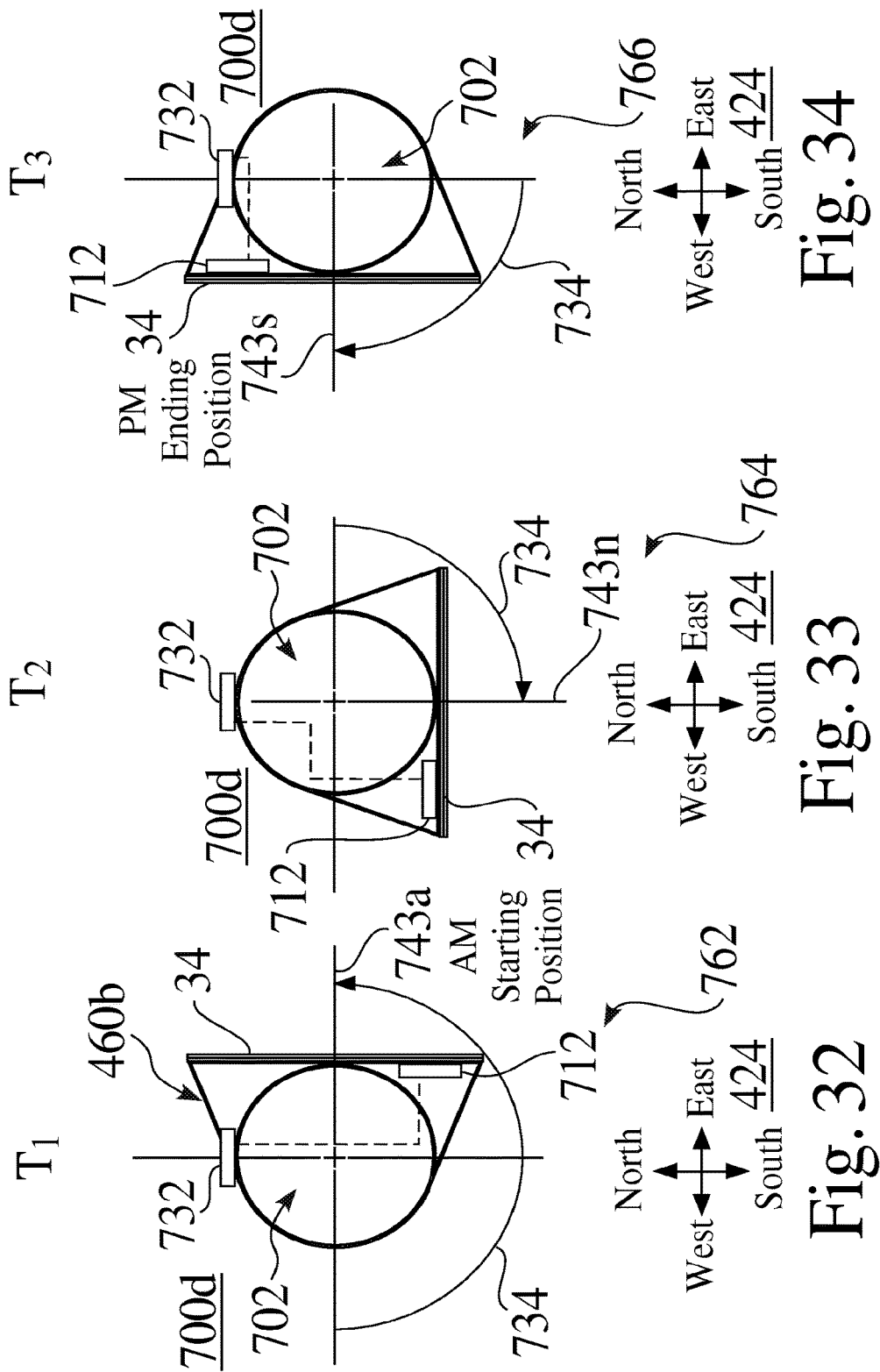

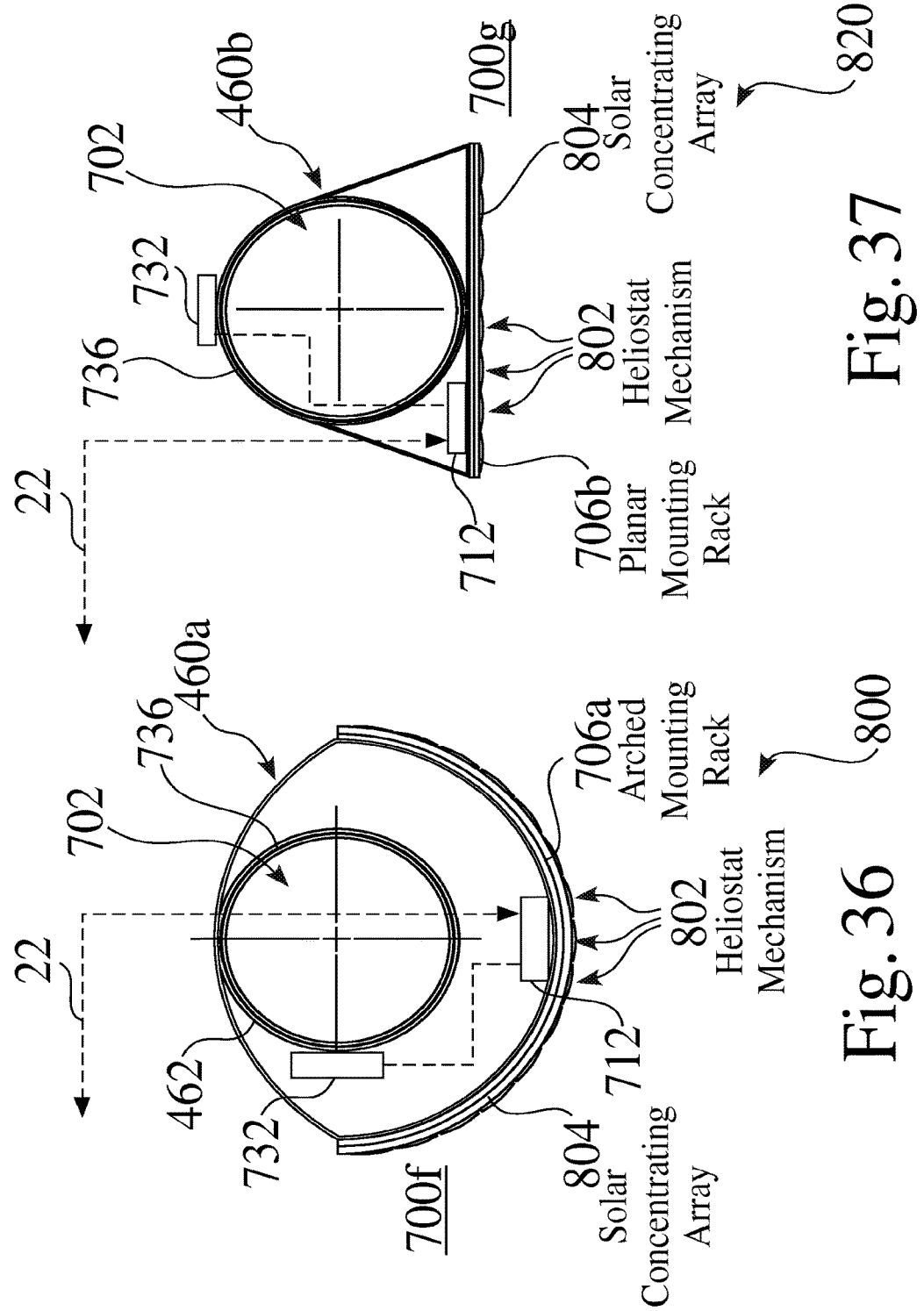

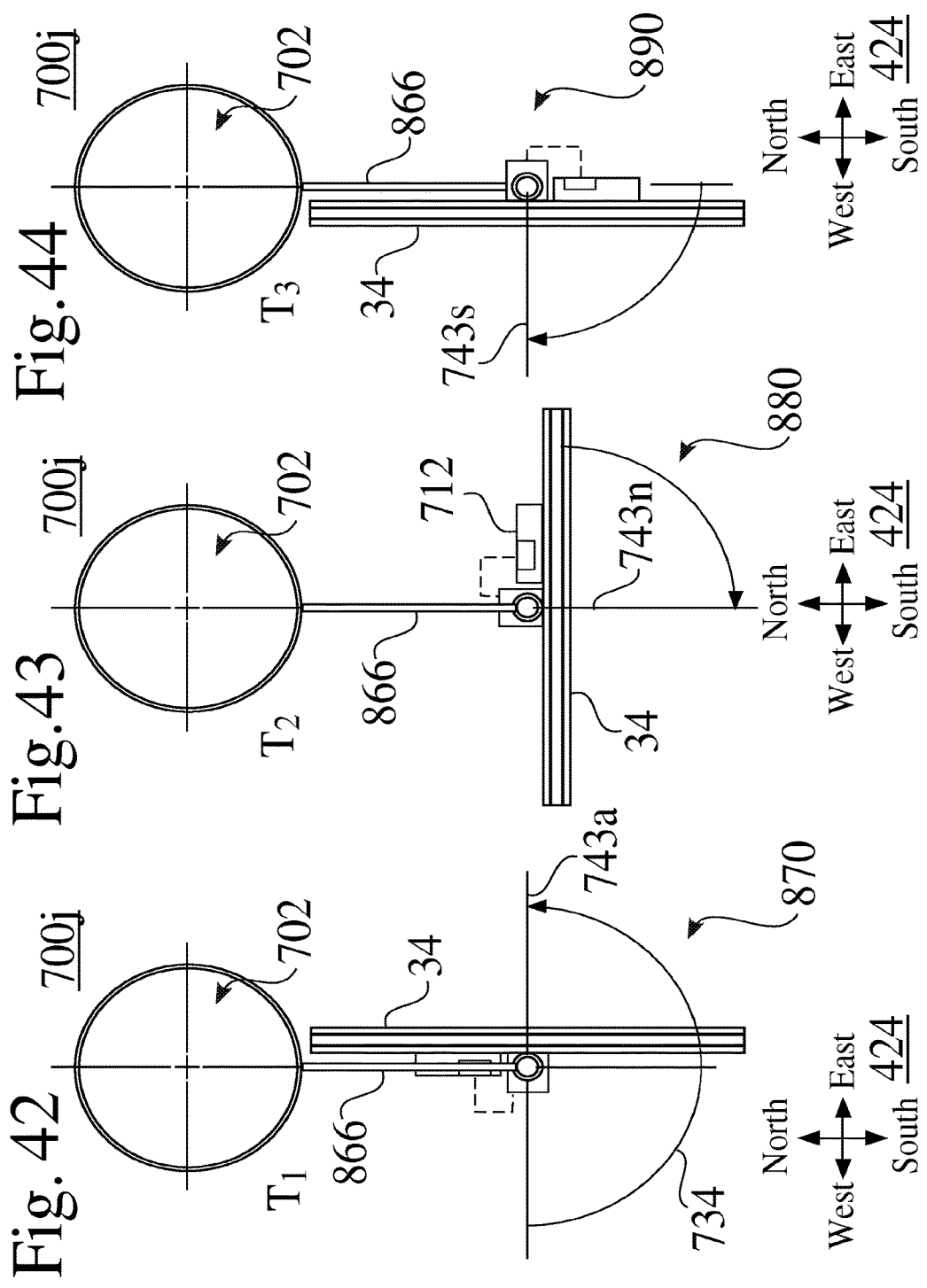

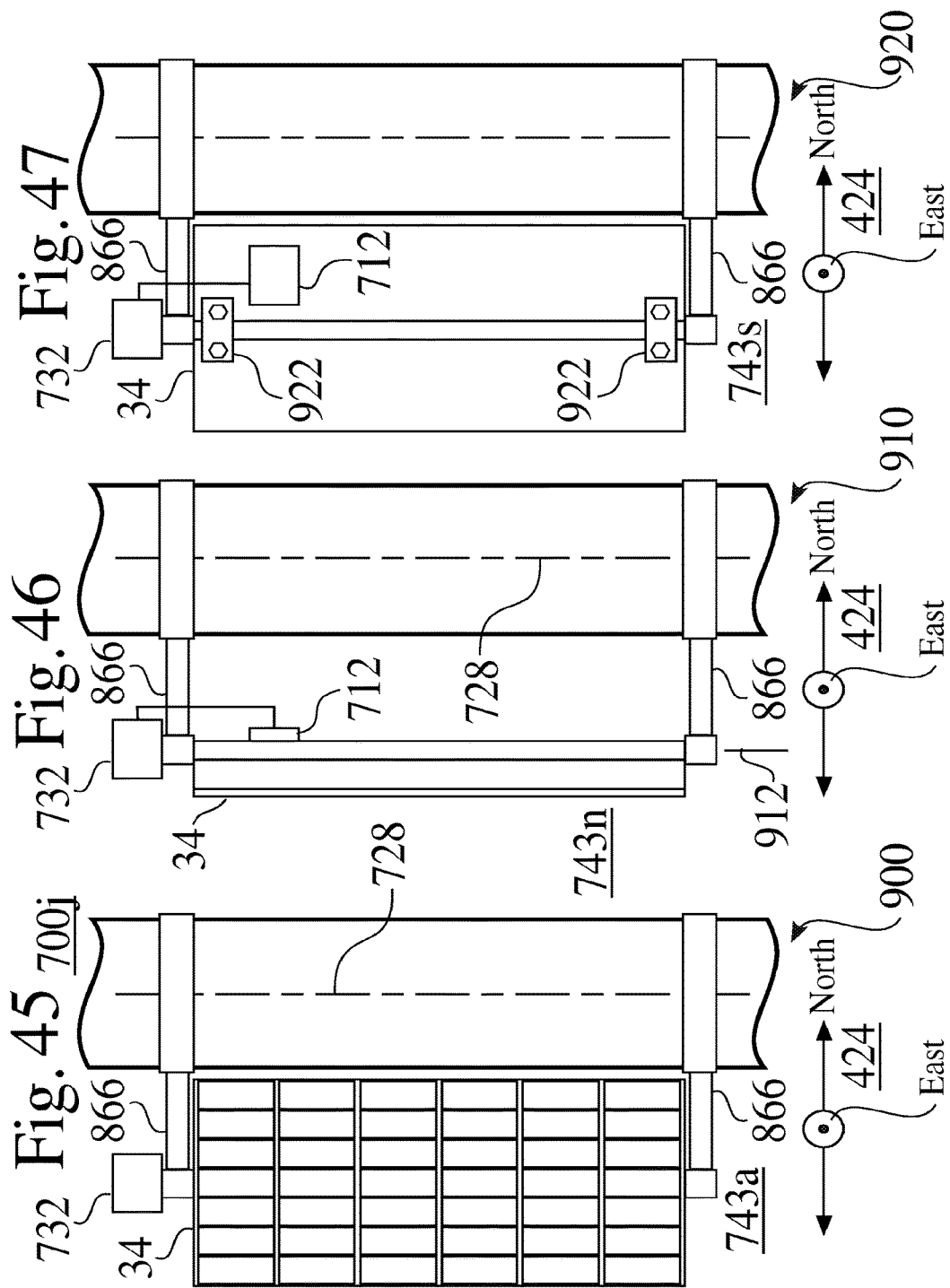

POLE-MOUNTED POWER GENERATION SYSTEMS, STRUCTURES AND PROCESSES

CROSS REFERENCE TO RELATED APPLICATIONS

This Application is a Continuation of U.S. application Ser. No. 14/949,611, filed Nov. 23, 2015, which is a Continuation of U.S. application Ser. No. 13/615,014, filed 13 Sep. 2012, which claims Priority to U.S. Provisional Application No. 61/534,802, entitled Pole-Mounted Systems, Structures and Processes with Distributed Maximum Power Point Tracking and Tracking Mechanisms, filed 14 Sep. 2011.

U.S. application Ser. No. 13/615,014 is also a Continuation in Part and claims priority for commonly disclosed matter to PCT Application No. PCT/US2010/045352, entitled Enhanced Solar Panels, Liquid Delivery Systems and Associated Processes for Solar Energy Systems, filed 12 Aug. 2010, which claims priority to U.S. Provisional Application No. 61/234,181, entitled Distributed Maximum Power Point Tracking System, Structure, and Process with Enhanced Solar Panel Coating, Cleaning and Cooling, filed 14 Aug. 2009.

PCT Application No. PCT/US2010/045352 is also a Continuation in Part and claims priority for commonly disclosed matter to U.S. application Ser. No. 12/842,864, entitled Distributed Maximum Power Point Tracking System, Structure and Process, filed 23 Jul. 2010, which was issued as U.S. Pat. No. 8,035,249 on 11 Oct. 2011, which is a Continuation of U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

U.S. application Ser. No. 13/615,014 is also a Continuation in Part and claims priority for commonly disclosed matter to U.S. application Ser. No. 13/250,887, entitled Distributed Maximum Power Point Tracking System, Structure and Process, filed 30 Sep. 2011, which was issued as U.S. Pat. No. 8,427,009 on 23 Apr. 2013, which is a Continuation of U.S. application Ser. No. 12/842,864, entitled Distributed Maximum Power Point Tracking System, Structure and Process, filed 23 Jul. 2010, which was issued as U.S. Pat. No. 8,035,249 on 11 Oct. 2011, which is a Continuation of U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908, 361, entitled Distributed Multiple Power Point Tracking, filed 27 Mar. 2007.

U.S. application Ser. No. 13/615,014 is also related to PCT Application No. PCT/US08/58473, entitled Distributed Maximum Power Point Tracking System, Structure and Process, filed 27 Mar. 2008, which claims priority to U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

BACKGROUND OF THE INVENTION

All public utilities in the United States have been tasked by the Federal Government to generate 25 percent of their electricity from renewable sources by 2020. Some states have mandated even higher percentages of renewable energy. For example, in 2011, California passed a law to raise the amount of renewable energy that all California utilities must use to 33 percent by 2020. While some states, such as California, already produce renewable energy through large hydropower installations, the need to increase electricity production through solar power is increasing rapidly.

Some current distributed solar panel installations, such as currently offered through Petra Solar, Inc., of South Plainfield N.J., comprise stationary brackets that are mountable to utility distribution poles, which support traditional, silicon-based, non-flexible solar panels that are locally connected to the power grid. In a typical installation, a 32 inch wide by 62 inch long silicon-based rigid solar panel is fixedly mounted at a +/−30 degree angle onto the a utility distribution pole.

Silicon panels are typically expensive, require direct light, and tolerate only a slight offset to the sun to provide power. As well, such silicon panels don't react to reflected light sources well. Furthermore, rigid silicon-based panels are fragile, and are susceptible to damage, such as by but not limited to rocks, bullets, or birds. As well, particularly when fixedly mounted at an inclined angle to a utility distribution pole, silicon-based panels are not self-cleaning, and are difficult to manually clean by hand.

It would be advantageous to provide a pole mounted solar power structure, process and system that provides enhanced power harvest, monitoring, and control for a wide variety of installations. The development of such a system would provide a significant advance to the efficiency and cost effectiveness of distributed power cells structures, processes, and systems.

One current alternative to traditional, silicon-based, non-flexible solar panels that are fixedly mounted to power distribution poles is offered through NextStep Electric, Inc., of Longmont, Colo. Flexible thin-film panels, having an adhesive backing, are wrapped directly to a power pole, and are connected to the local power grid through a microinverter 712. When the mounting surface of the pole surface is clean, uncluttered, and consistent, the adhesive mounting of flexible thin-film panels may provide a fast, simple, and inexpensive installation. As the flexible panels are mounted vertically to the ground, they can be considered to be at least partially self-cleaning, since less dirt accumulates on the vertical panel surfaces, and at least a portion of any accumulated dirt is cleaned through any of wind, rain, dew, or fog.

Thin-film panels are typically less fragile than silicon panels. In most cases, a thrown rock will bounce off the panel without harm. While a gunshot may penetrate the panel and cause a small loss of efficiency, it will not normally disable the panel as with silicon. Furthermore, thin-film technology is more tolerant at producing electricity from indirect and reflected light than are traditional, silicon-based solar panels.

While installations that comprise flexible thin-film panels that are attached directly to power poles may provide easier installation, improved cleaning, and tolerance to incident light direction to that of traditional, silicon-based, non-flexible solar panels, such installations are inherently limited to the available circumferential surface area of the utility pole.

It would be advantageous to provide a pole mounted solar power structure, process and system that provides a greater surface area than that of flexible thin-film panels that are attached directly to power poles, which also provides any of enhanced cleaning, robustness, monitoring, and control for a wide variety of installations. The development of such a system would provide a further significant advance.

SUMMARY OF THE INVENTION

Solar power systems and structures are mountable to a power distribution structure, e.g. a power pole or tower, which supports alternating current (AC) power transmission lines. An exemplary power generation structure is fixedly attached to and extends from the power distribution structure, and comprises a mounting rack. A solar array comprising at least one solar panel is affixed to the mounting rack. A DC to AC inverter is connected between the DC outputs of the solar array and the AC power transmission lines. The length of the solar array is generally in alignment with the power distribution structure, and the width of the solar array is greater than half the circumference of the power distribution structure. The mounting rack and solar array may preferably be rotatable, such as based on any of location, time of day, or available light.

BRIEF DESCRIPTION OF THE DRAWINGS

FIG. 15 is top schematic view of an exemplary horizontal channel stay;

FIG. 16 is a front schematic view of an exemplary horizontal channel stay;

FIG. 17 is a side schematic view of an exemplary horizontal channel stay;

FIG. 18 is a perspective view of an exemplary horizontal channel stay;

FIG. 24 is a partial schematic view of an exemplary pole-mounted rotatable arched solar power structure;

FIG. 25 is a partial front view of an exemplary pole-mounted rotatable arched solar power structure;

FIG. 26 is a partial schematic view of an exemplary pole-mounted rotatable arched solar power structure located in the Northern Hemisphere at a first time, wherein the solar array is rotatably positioned in a generally Eastward direction;

FIG. 27 is a partial schematic view of an exemplary pole-mounted rotatable arched solar power structure located in the Northern Hemisphere at a second time, wherein the solar array is rotatably positioned in a generally Southward direction;

FIG. 28 is a partial schematic view of an exemplary pole-mounted rotatable arched solar power structure located in the Northern Hemisphere at a third time, wherein the solar array is rotatably positioned in a generally Westward direction;

FIG. 32 is a partial schematic view of an exemplary pole-mounted rotatable flat solar power structure located in the Northern Hemisphere at a first time, wherein the solar array is rotatably positioned in a generally Eastward direction;

FIG. 33 is a partial schematic view of an exemplary pole-mounted rotatable flat solar power structure located in the Northern Hemisphere at a second time, wherein the solar array is rotatably positioned in a generally Southward direction;

FIG. 34 is a partial schematic view of an exemplary pole-mounted rotatable flat solar power structure located in the Northern Hemisphere at a third time, wherein the solar array is rotatably positioned in a generally Westward direction;

FIG. 36 is a partial schematic view of an exemplary pole-mounted arched solar concentrating power structure;

FIG. 37 is a partial schematic view of an exemplary pole-mounted flat solar concentrating power structure;

FIG. 42 is a partial bird's eye schematic view of an exemplary pole-mounted rotatable flat solar power structure located in the Northern Hemisphere at a first time, wherein the solar array is rotatably positioned in a generally Eastward direction;

FIG. 43 is a partial bird's eye schematic view of an exemplary pole-mounted rotatable flat solar power structure located in the Northern Hemisphere at a second time, wherein the solar array is rotatably positioned in a generally Southward direction;

FIG. 44 is a partial bird's eye schematic view of an exemplary pole-mounted rotatable flat solar power structure located in the Northern Hemisphere at a third time, wherein the solar array is rotatably positioned in a generally Westward direction;

FIG. 45 is a side schematic view of an exemplary pole-mounted rotatable flat solar power structure located in the Northern Hemisphere at a first time, wherein the solar array is rotatably positioned in a generally Eastward direction;

FIG. 46 is a side schematic view of an exemplary pole-mounted rotatable flat solar power structure located in the Northern Hemisphere at a second time, wherein the solar array is rotatably positioned in a generally Southward direction; and FIG. 47 is a side schematic view of an exemplary pole-mounted rotatable flat solar power structure located in the Northern Hemisphere at a third time, wherein the solar array is rotatably positioned in a generally Westward direction.

DETAILED DESCRIPTION OF PREFERRED EMBODIMENTS

Figure 1:
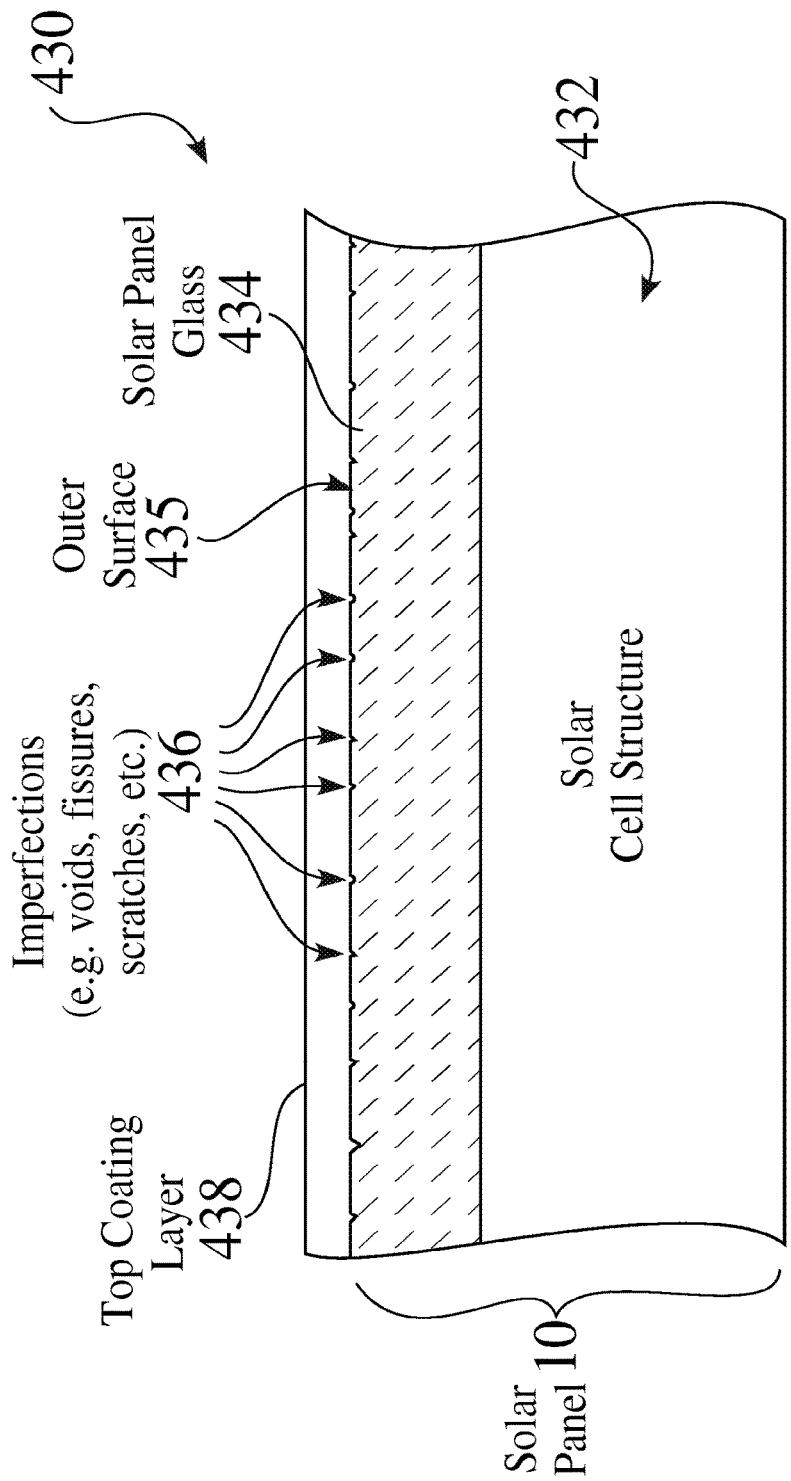
FIG. 1 is a partial cutaway view of an enhanced solar panel structure having an outer coating layer.

Enhanced Coated Power Panels. The efficiency of solar panels 10 falls off rapidly as dirt and other impurities settles on the outer surface 435 of the panels 10. The outer glass substrates 434 (FIG. 1) on the surface of solar panels 10, e.g. conventional solar panels 10, typically contain microscopic voids, fissures, and/or scratches 436, making them rough, wherein dust, dirt, scale, particulates, and other contaminants can readily adhere to the glass 434.

FIG. 1 is a partial cutaway view of an enhanced solar panel structure 430 having a top coating layer 438. It is advantageous to provide such improvements to the outer optical structures 432,434 for solar panels 10, such as to provide enhanced cleaning, and/or to provide improved light adsorption. Coatings 438 can be applied to any of:
- used, i.e. existing, solar panels 10 (such as with pre-cleaning);
- new but conventional solar panels 10, e.g. in the field (such as with pre-treatment/cleaning); and/or
- new enhanced solar panels 10, with enhanced coatings 438 applied during production (before shipment).

In some embodiments, the coating materials 438 are described as nano-technology materials, as they provide enhanced cleaning and/or improved light adsorption on any of a macroscopic or microscopic level. For example, the coatings 438 may preferably fill in or reduce voids fissures, and/or scratches 436. As well, the coatings 438 may preferably prevent or reduce buildup of dust, dirt, scale, particulates, and/or other contaminants on the solar panel glass 434.

In some embodiments, the enhanced coatings may preferably comprise hydrophobic coatings 438, e.g. comprising silicon oxide, and/or hydrophilic coatings 438, e.g. comprising titanium oxide.

For example a thin layer, e.g. such as but not limited to about 5,000 Angstroms thick, of a hydrophobic coating 438, provides a surface to which dust and dirt has difficulty adhering. One such hydrophobic coating 438 currently used comprises a Teflon™ based coating 438, wherein incoming water, such as sprayed on, poured on, or occurring through other means, e.g. rain, condensation, or fog, beads up on the glass 434, such as by reducing the surface contact between the liquid and the glass 434, and allowing the water to roll off, thereby accelerating the cleaning process.

The use of hydrophilic coatings 438, coupled with sunlight and moisture, may preferably react with deposits that land on the glass 434, such as to break down organic material to a point where it blows away in the wind, or washes off with water.

In some exemplary embodiments, the enhanced coatings may preferably comprise hydrophobic coatings 438, e.g. comprising silicon oxide, or hydrophilic coatings 438, e.g. comprising titanium oxide.

Other exemplary embodiments of the enhanced coatings 438 comprise both hydrophilic and hydrophobic components, such as to provide a coating material that provides any of reaction with and/or repelling incident water and/or contaminants.

Further exemplary embodiments of the enhanced coatings 438 may preferably comprise a component, e.g. an interference coating 438, that reduces the reflectivity of the glass 434, such as to allow more light to penetrate the glass and strike the solar cell structure 432, to produce more electricity.

Solar panels 10, e.g. such as conventional solar panels may therefore be enhanced by any of a wide variety of coatings 438, such as to repel water, absorb light, and/or break down organic material. Such enhanced coatings 438 may preferably be used for any of reducing dirt buildup on solar panel glass layers 434, reducing cleaning time, and/or increasing the level of cleanliness achievable through cleaning procedures.

Rack Mounting Angles for Solar Panel Arrays.

Figure 2:
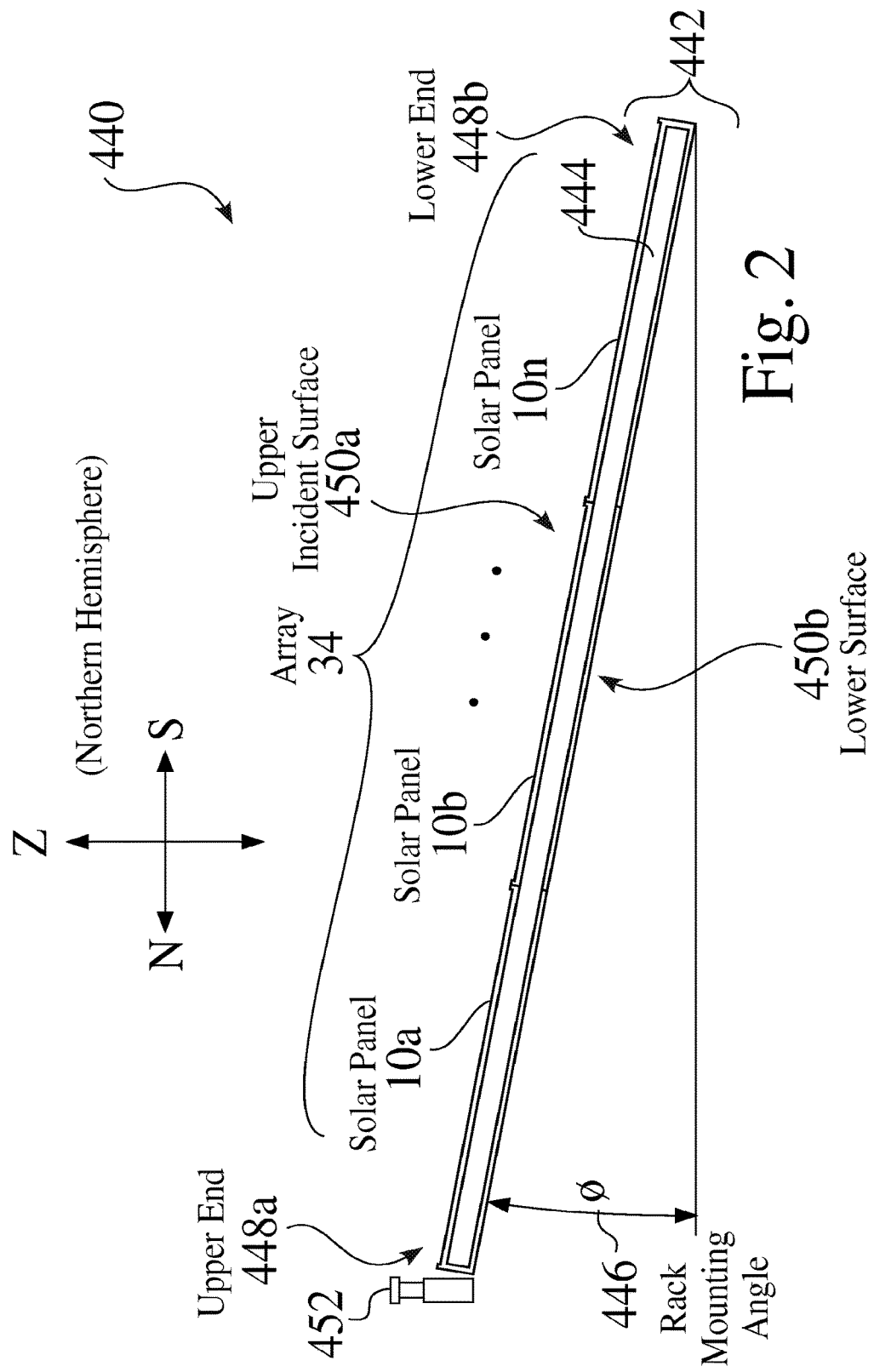
FIG. 2 is a simplified schematic view of an array of enhanced solar panels having a rack mounting angle.

FIG. 2 is a simplified schematic view 440 of an array 34 of solar panels 10, e.g. enhanced solar panels 10*a*-10*n*, such as assembled with one or more frame members 444, having a rack mounting angle ø 446.

Fluid delivery systems 452, such as but not limited to a manifold and one or more spray mechanisms, may preferably provide any of cleaning and/or cooling for one or more solar panels 10, such as by spraying or otherwise distributing water, which may further comprise a cleaner, over the incident surfaces 450*a* of an array 34 of one or more panels 10.

As seen in FIG. 2, the exemplary panels 10 have a rack mounting angle 446. Conventional solar panel arrays have commonly been mounted with a rack angle 446 greater than zero degrees, such as to provide an increase in power harvest. For example, many solar panel arrays 34 located in the Northern hemisphere have a rack mounting angle of about 8-10 degrees.

A conventional array 34 of solar panels 10 that are installed flat on a flat roof can theoretically provide 100 percent coverage across the roof, while a conventional array of solar panels 10 that are installed with an eight degree slope on such a roof provides about 90 percent coverage, because of the aisle typically required between racking systems, such as to avoid shading between racks.

Panel arrays 34 that have substantially higher rack angles, e.g. 20 degrees, have a higher front to back height ratio, which typically requires a larger distance between the racking structural rows, thereby resulting in less room for panels 10, such as for a horizontal roof installation. e.g. about 70 percent coverage for a flat roof system.

In an enhanced power generation system 40 that includes a fluid delivery system 452, such as for cleaning and/or cooling, the rack angle 446 may preferably be chosen for fluid movement, e.g. water run off, as well as for power harvest.

For example, one current embodiment of an enhanced power generation system 40 that includes a fluid delivery system 452, installed in Menlo Park, Calif., has a rack mounting angle 446 of about 8 degrees toward the South, which serves to increase power harvest and also allows testing of a fluid delivery system 452.

The specific rack angle 446 for a solar panel installation may preferably be chosen to facilitate self-cleaning during rainfall, automated, i.e. robotic, cleaning, and/or automated cooling, such as to reduce or avoid maintenance and/or cleaning problems associated with flat mounted panels 10.

For example, for the specific solar panels 10 used for the aforementioned installation, and as recommended for many fluid delivery systems 452, a rack angle 446 of at least 10 degrees (toward the South in the Northern hemisphere or toward the North in the Southern hemisphere) may preferably provide greater fluid movement, e.g. water run off, such as to decrease residual build up of impurities along the surface and lower edges of the solar panels 10.

As the rack mounting angle 446 is increased, such as between 15-20 degrees toward the Equator, fluid runoff is increased, which can promote fluid reclamation and avoid deposition of contaminants at the lower edges of solar panels 10. The increased rack angle 446 also typically allows for a higher total year round harvest of electricity for installations that can accommodate such configurations, since in the winter, the Sun is lower on the horizon, so the additional tilt 446 of the panels 10 allows more light to be harvested. Because the higher slope results in better cleaning, there is a trade off between effective cleaning and the concentration of panels 10 on the roof.

Enhanced Pole-Mounted Solar Power Systems, Structures and Processes.

Enhanced solar power structures provide a wide variety of solutions for solar power production throughout many distributed environments.

Numerous regions within the United States and across the world use power distribution structures 702, such as but not limited to elevated poles and/or towers 702 (FIG. 22, FIG. 23), to support power lines 704 (FIG. 22, FIG. 23) and/or phone lines, wherein the poles and/or towers 702 are typically installed, operated, and maintained by respective utilities. While some areas, such as within urban or suburban environments, have installed power lines 702 and/or communication land lines below ground, a vast number or poles and towers 702 remain in service.

Several embodiments of enhanced power structures 700, e.g. 700*a* (FIG. 22); 700*j* (FIG. 41), are mountable to such poles and/or towers 702, to provide localized controlled production of solar power, which may preferably further comprise a local DC to AC power inverter 54 that is connectable 714 to the neighboring power grid 58, and may be configured to send and/or receive signals 722 (FIG. 22) over respective communication links 22.

The exemplary enhanced power structures 700 disclosed herein typically provide support for one or more solar panels 10, such as for but not limited to flat or arched embodiments 700. In stationary embodiments 700, the panels 10 may preferably be aligned toward the Equator, wherein the panels 10 may preferably be aligned toward the South if installed in the Northern Hemisphere, or toward the North, if installed in the Southern Hemisphere.

Rotatable configurations of enhanced power structures 700 are also disclosed herein, wherein the solar arrays 34 may be aligned to increase the power harvest based on any of location, time of day, available light, or any combination thereof. For example, some embodiments of the enhanced power structures 700 are controllably rotatable to face toward East in the morning, toward the South at midday, and toward the West at sunset.

Panel Mount Structures.

Figure 3:
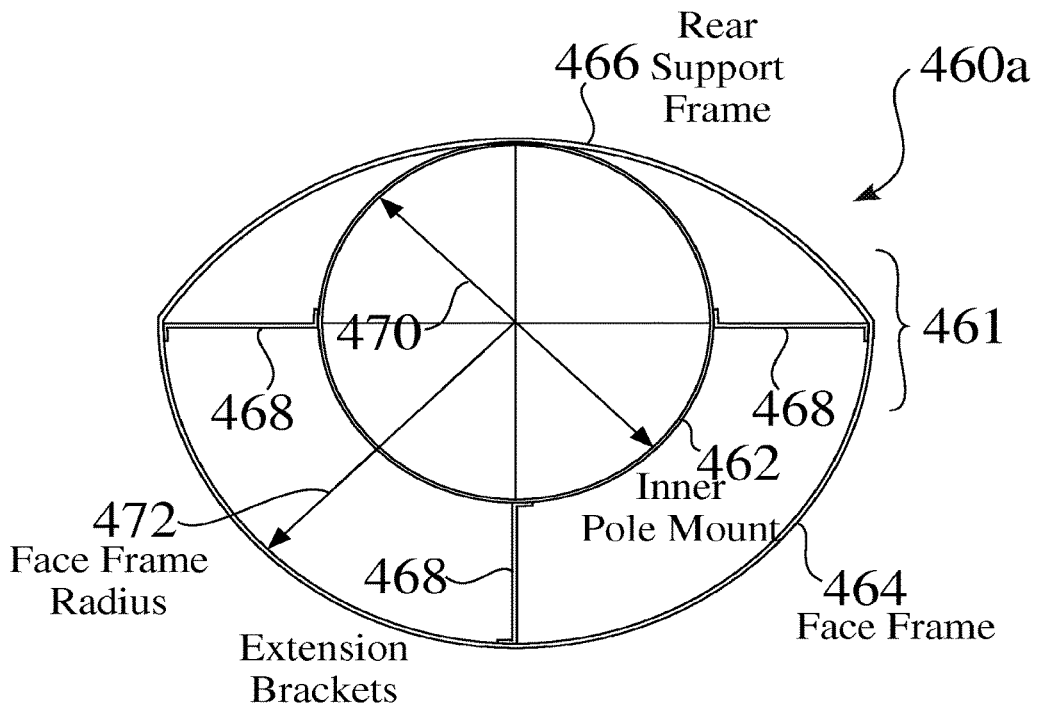
FIG. 3 is a top schematic view of an exemplary curved panel mount.
Figure 4:
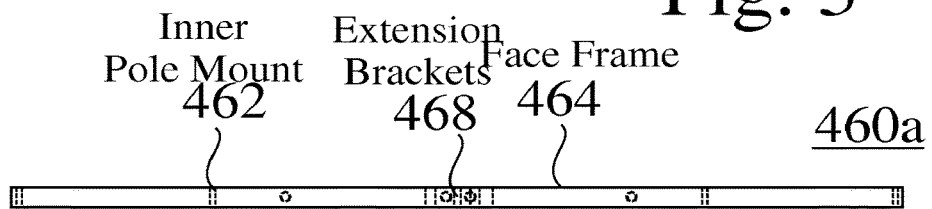
FIG. 4 is a front schematic view of an exemplary curved panel mount.
Figure 5:
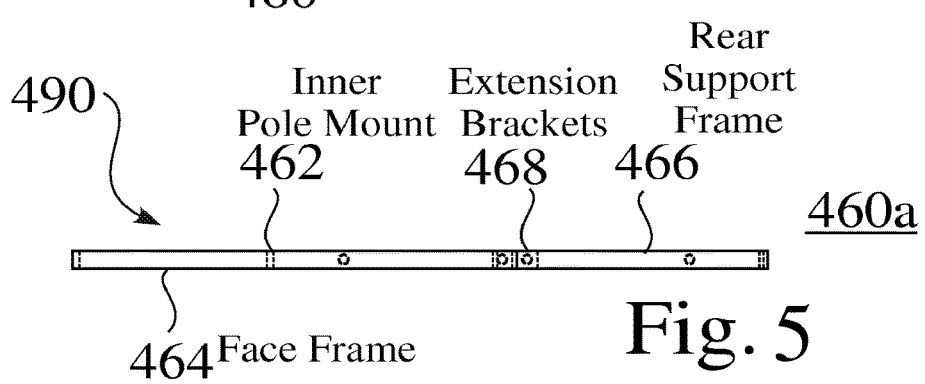
FIG. 5 is a side schematic view of an exemplary curved panel mount.
Figure 6:
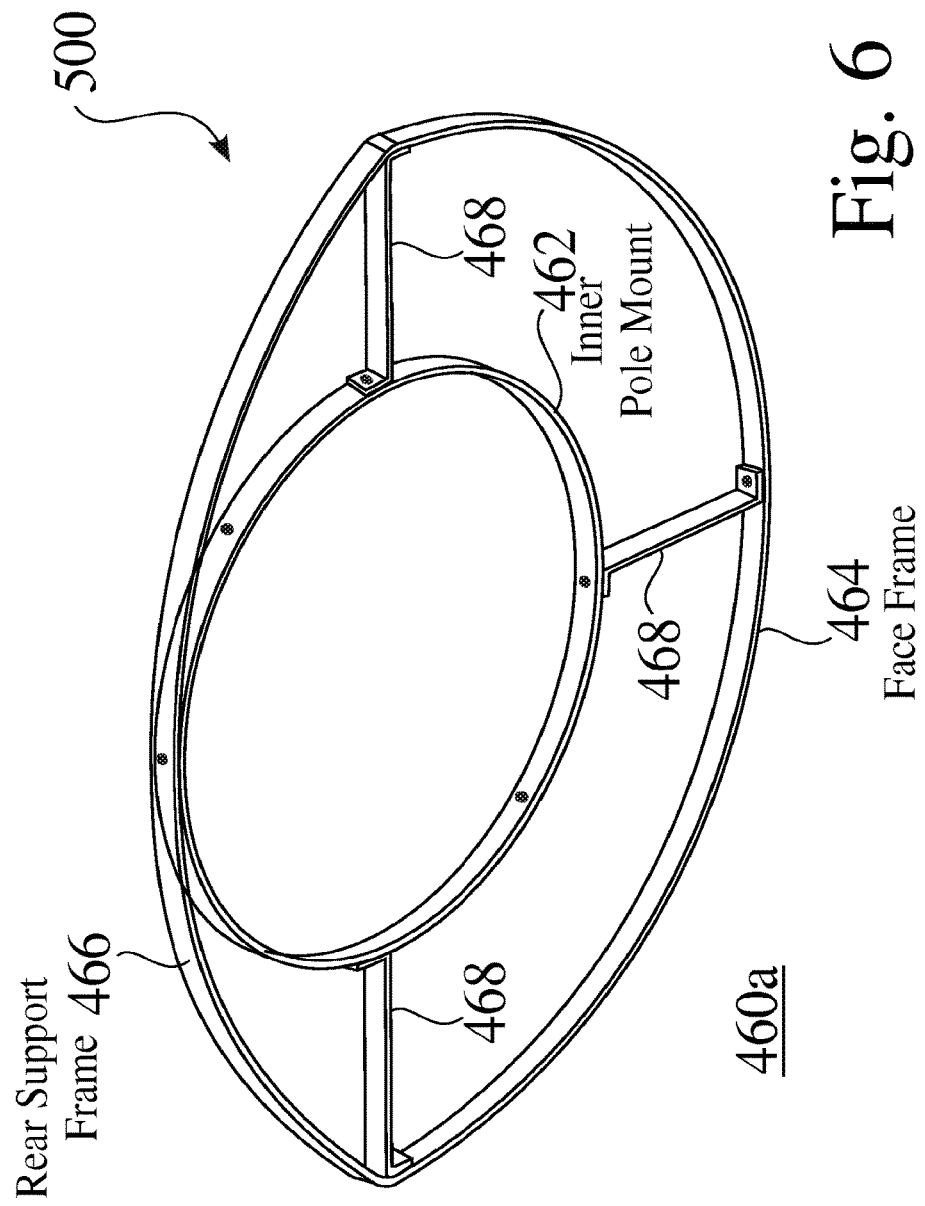
FIG. 6 is a perspective view of an exemplary curved panel mount.

FIG. 3 is a top schematic view of an exemplary curved frame structure 460*a*. FIG. 4 is a front schematic view 480 of an exemplary curved frame structure 460*a*. FIG. 5 is a side schematic view 490 of an exemplary curved frame structure 460*a*. FIG. 6 is a perspective view 500 of an exemplary curved frame structure 460*a*. In some embodiments, the curved frame structures 460*a* are comprised of corrosion resistant metal strips 462,464,466,468, e.g. such as comprising but not limited to stainless steel.

The exemplary curved frame structure 460*a* seen in FIG. 3 comprises an inner pole mount 462, which may be directly connectable to a pole structure 702, such as for stationary structures 700, or may be rotatably mounted to a pole structure 702, such as with a concentric bearing assembly 736 (FIG. 24), for rotatable power generation structures 700. The exemplary curved frame structure 460*a* seen in FIG. 3 also comprises a curved face frame 464 and a rear support frame 466, which are fixably attached to the inner pole mount 462, such as with extension brackets 468. The exemplary curved frame structure 460*a* seen in FIG. 3 to FIG. 6 may preferably be constructed with fasteners, or weldably fabricated.

Figure 7:
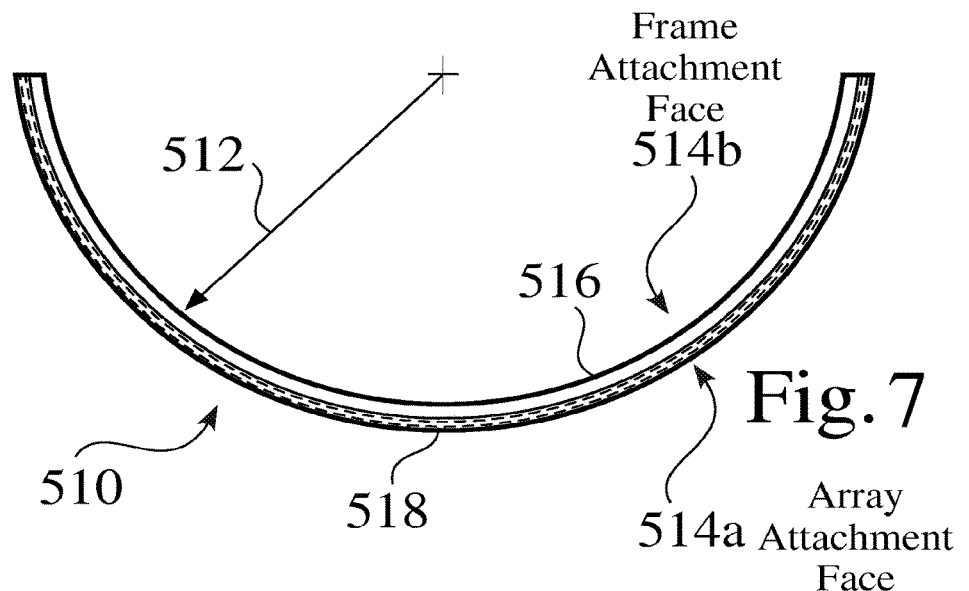
FIG. 7 is a top schematic view of an exemplary curved channel stay.
Figure 8:
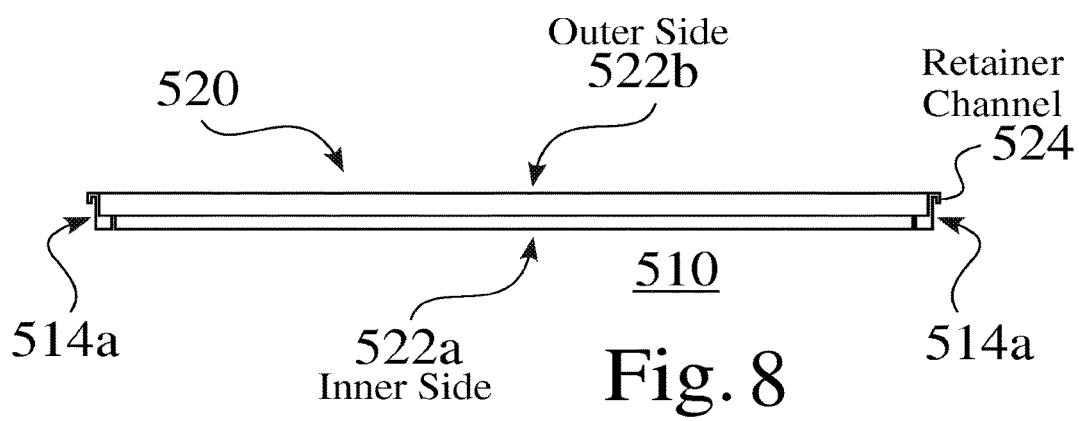
FIG. 8 is a front schematic view of an exemplary curved channel stay.

FIG. 7 is a top schematic view of an exemplary curved channel stay 510. FIG. 8 is a front schematic view 520 of an exemplary curved channel stay 510, having an inner side 522*a* that corresponds to an attached solar array 34, and an outer side 522*b* opposite the inner side 522*a*. The exemplary curved channel stay seen in FIG. 7 comprises a frame attachment face 514*b* having a mounting surface 516, such as for connection to a curved face frame 464 (FIG. 32). The radius 512 of the frame attachment face 514*b* corresponds to the outer convex surface of the curved face frame 464. The exemplary curved channel stay seen in FIG. 7 also comprises a convex array attachment face 514*a* opposite the concave frame attachment face 514*b*, which comprises an attachment boss 518 having a channel 524 for retaining a solar array 34, comprising one or more solar panel 10.

Figure 9:
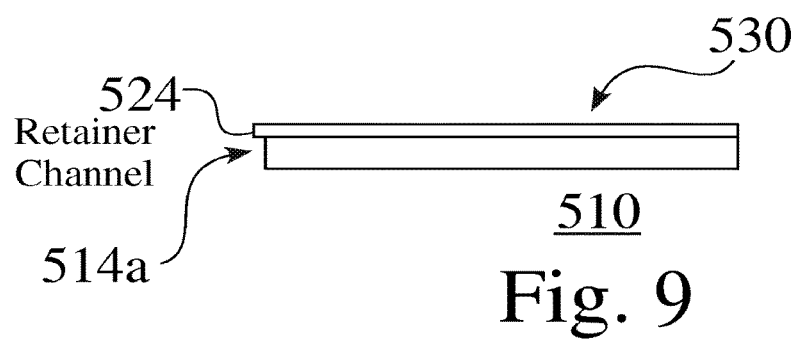
FIG. 9 is a side schematic view of an exemplary curved channel stay.
Figure 10:
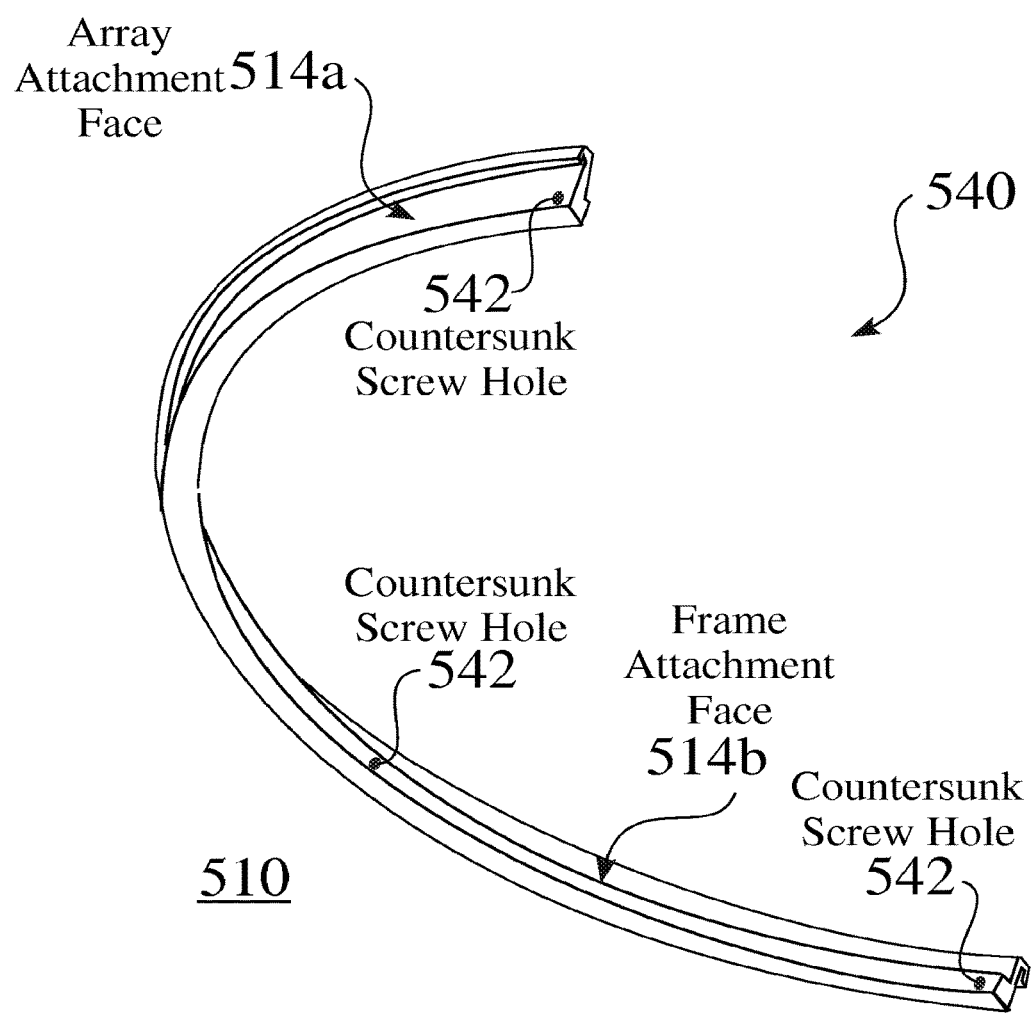
FIG. 10 is a perspective view of an exemplary curved channel stay.
Figure 21:
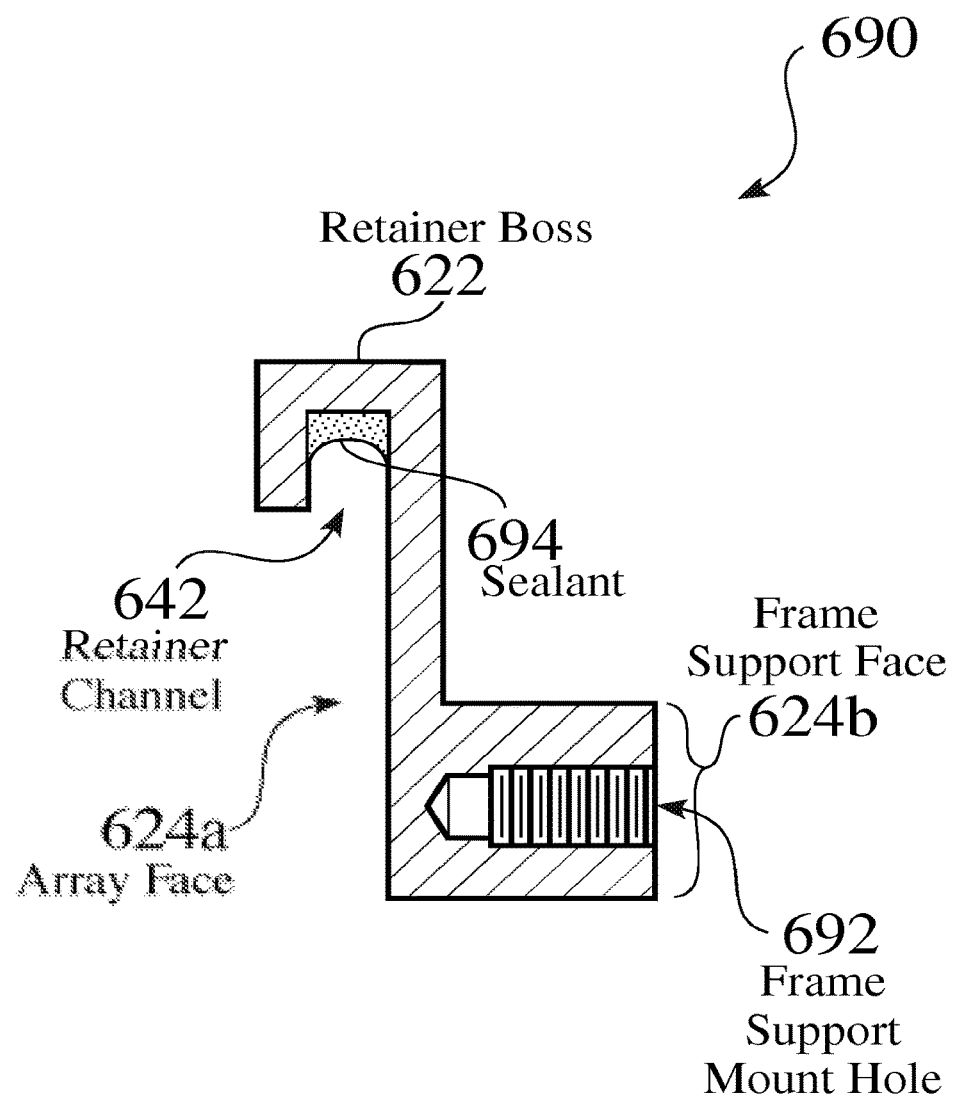
FIG. 21 is a partial cutaway view of an exemplary vertical channel stay.

FIG. 9 is a side schematic view 530 of an exemplary curved channel stay 510. FIG. 10 is a perspective view 540 of an exemplary curved channel stay 510. In some embodiments, screw holes 542 (FIG. 10) are defined in the curved channel stays 510, and may preferably be countersunk to avoid interference. To mount the main support, the user USR first slides a solar array 34 into place, using vertical channel stays 690 (FIG. 21). Once in place, the top and bottom curved channel stays 510 are bolted, to lock the solar panel 10 in place. A sealant 694 (FIG. 21), e.g. an epoxy sealant, may be applied to hold the solar panel 10 in the respective channels 524.

Figure 11:
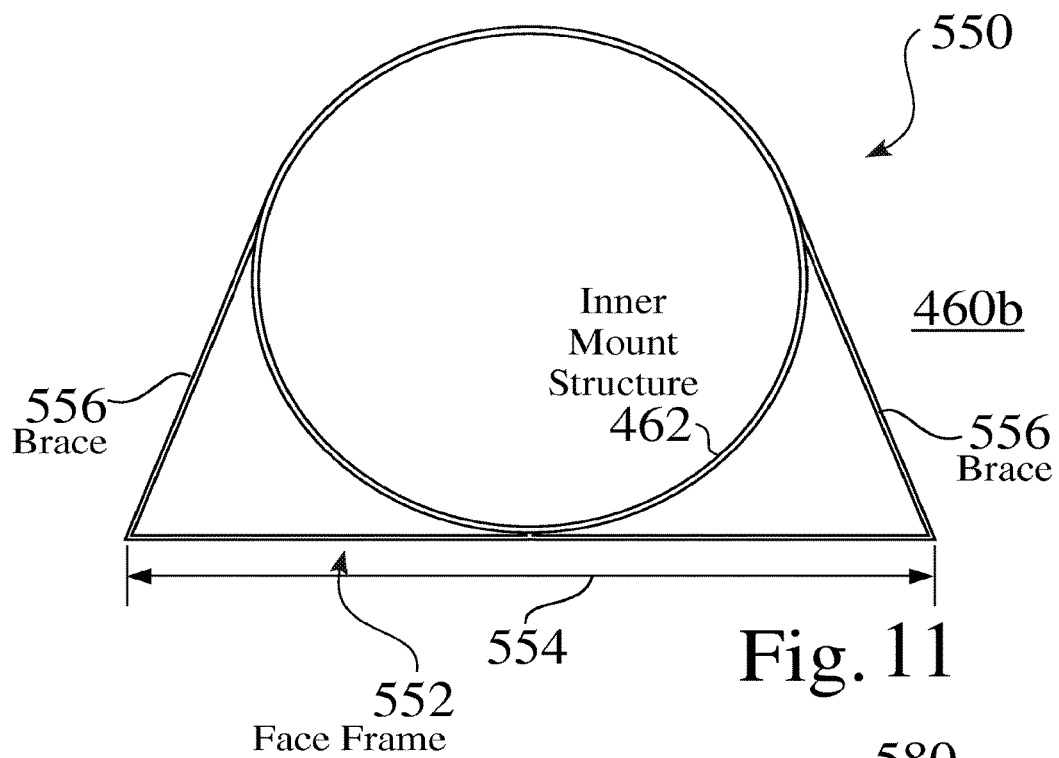
FIG. 11 is top schematic view of an exemplary flat panel mounting bracket.
Figure 12:
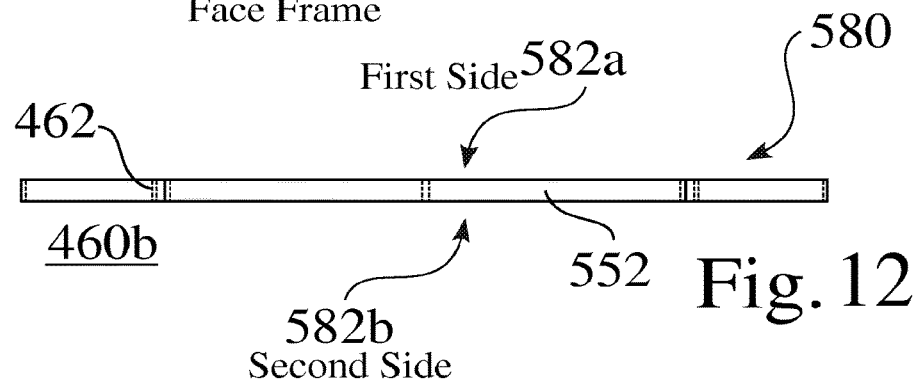
FIG. 12 is a front schematic view of an exemplary flat panel mounting bracket.
Figure 13:
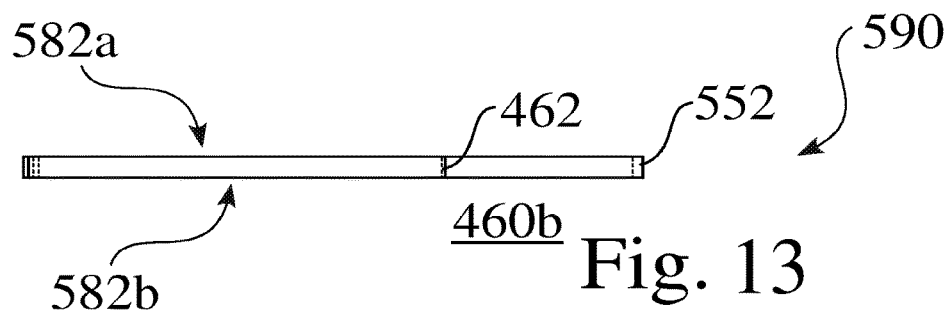
FIG. 13 is a side schematic view of an exemplary flat panel mounting bracket.
Figure 14:
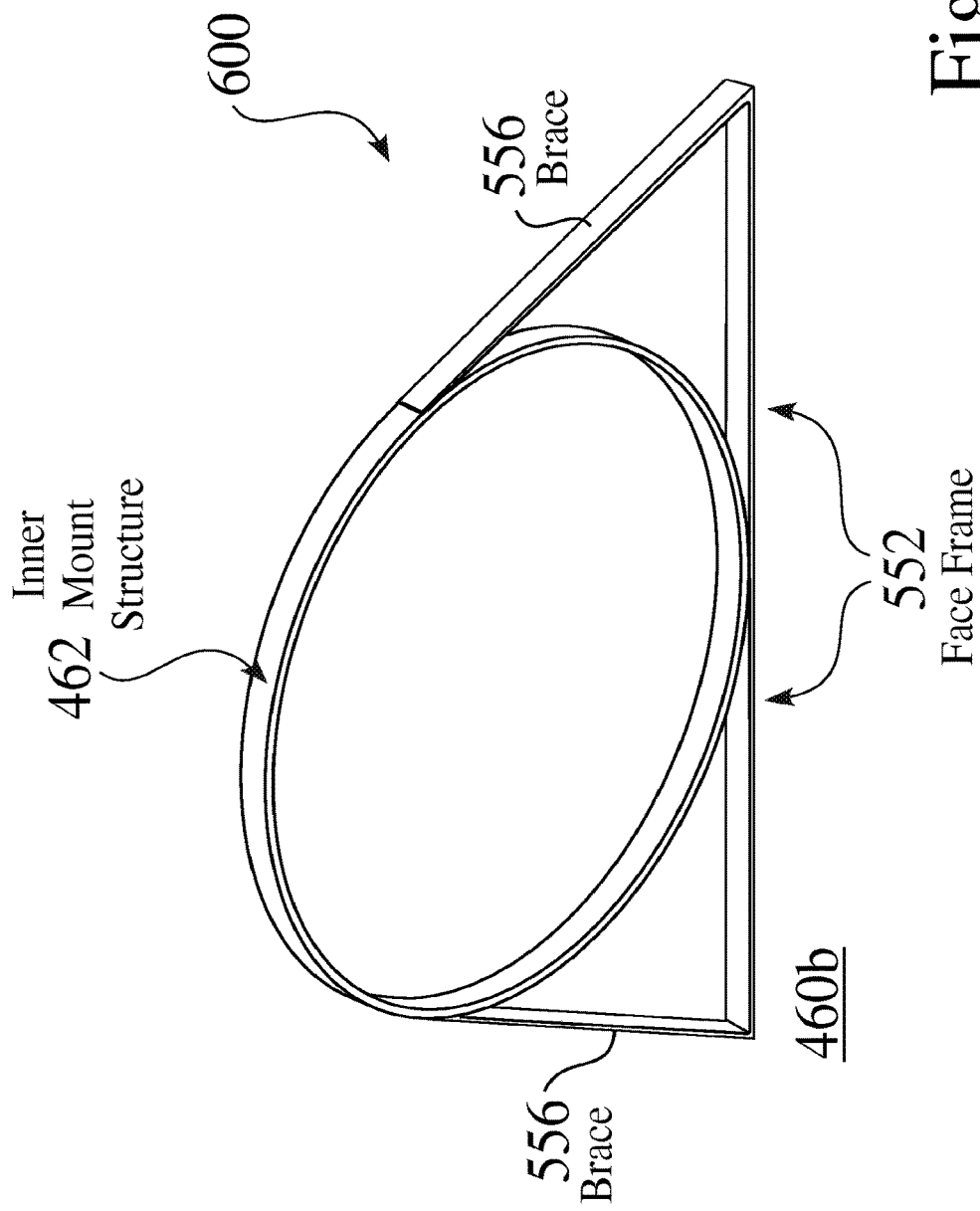
FIG. 14 is a perspective view of an exemplary flat panel mounting bracket.

FIG. 11 is top schematic view of an exemplary flat panel mounting frame 460*b*. The exemplary frame structure 460*b* seen in FIG. 11 comprises an inner pole mount structure 462, which may be directly connectable to a pole structure 702, such as for stationary structures 700, or may be rotatably mounted to a pole structure 702, such as with a concentric bearing assembly 736 (FIG. 24), for rotatable power generation structures 700. The exemplary frame structure 460*b* seen in FIG. 11 also comprises a planar face frame 552, such as having a defined width 554, e.g. 24 inches, and braces 566 that are fixably attached between the inner pole mount 462 and the planar face frame 552. FIG. 12 is a front schematic view 580 of an exemplary planar panel mounting frame 460*b*, having a first side 582*a*, and a second side 582*b* opposite the first side 582*a*. FIG. 13 is a side schematic view 590 of an exemplary planar panel mounting frame 460*b*. FIG. 14 is a perspective view 600 of an exemplary planar panel mounting frame 460*b*. In some embodiments, the planar panel mounting frames 460*b* are comprised of corrosion resistant metal strips, e.g. stainless steel, such as for ease of use and longevity in the field. The exemplary planar frame structures 460*b* seen in FIG. 11 to FIG. 14 may preferably be constructed with fasteners, or may be weldably fabricated.

FIG. 15 is top schematic view of an exemplary planar channel stay 620. FIG. 16 is a front schematic view 630 of an exemplary planar channel stay 620. FIG. 17 is a side schematic view 640 of an exemplary planar channel stay 620. FIG. 18 is a perspective view 650 of an exemplary planar channel stay 620. In some embodiments, the planar channel stays 620 are mounted using the same procedure as the curved channel stay 510, and may preferably be comprised from stainless steel extrusions, such as to prevent galvanic reactions. In some embodiments, the planar channel stays 620 have the same cross-sectional profile as the curved channel stays 510 or vertical channel stays 690 (FIG. 21).

Figure 19:
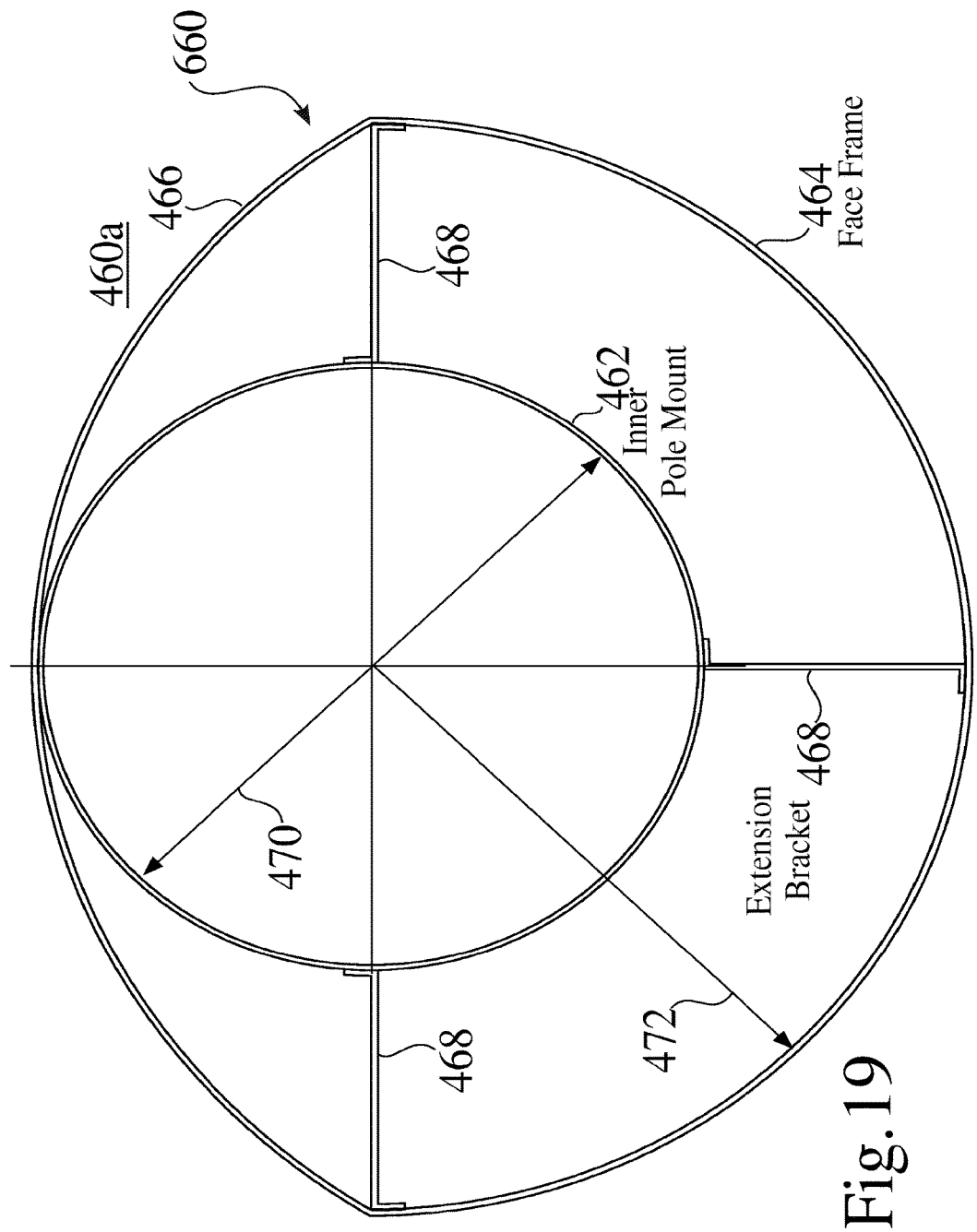
FIG. 19 is a detailed top schematic view of an alternate embodiment of a curved panel mount.

FIG. 19 is a detailed top schematic view 660 of an alternate embodiment of a curved frame structure 460*a*, such as comprised of stainless steel bands, wherein the material may preferably be chosen to have a sufficient yield strength to support the assembly. Holes through the curved panel mount may preferably be countersunk, such as to avoid any bolt interference.

Figure 20:
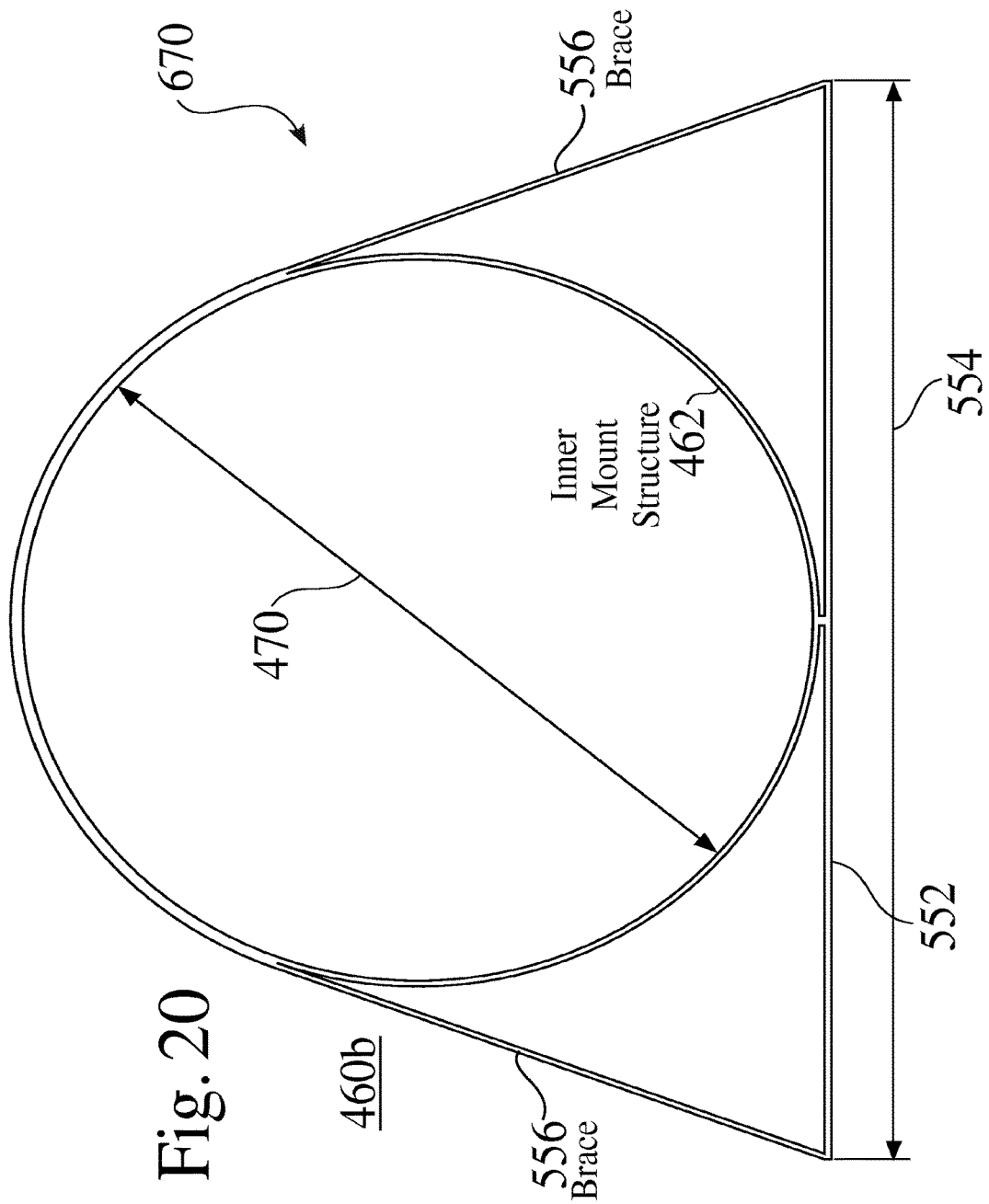
FIG. 20 is a detailed top schematic view of an alternate embodiment of a flat panel mount.

FIG. 20 is a detailed top schematic view 670 of an alternate embodiment of a planar frame structure 460*b*, which may be comprised in a similar manner to the curved frame structure 460*a* seen in FIG. 19, e.g. such as comprised of stainless steel bands, wherein the material may preferably be chosen to have a sufficient yield strength to support the assembly. The use of stainless steel bands may also provide some adjustability, such as for connection to a wide variety of power utility poles 702.

FIG. 21 is a partial cutaway view of an exemplary vertical channel stay 690. In some embodiments, the length of the vertical channel stay is 118 inches when used with the curved channel stays 510. In other embodiments, the length of the vertical channel stay 690 is 79 inches when used with the planar channel stays 620. The holes 692 defined in the vertical channel stay 690 may preferably be counter bored, such as to allow for four mounting points for attachment to curved frame structures 460*a* or planar frame structures 460*b*.

Pole-Mounted Stationary Arched Solar Power Structures.

Figure 22:
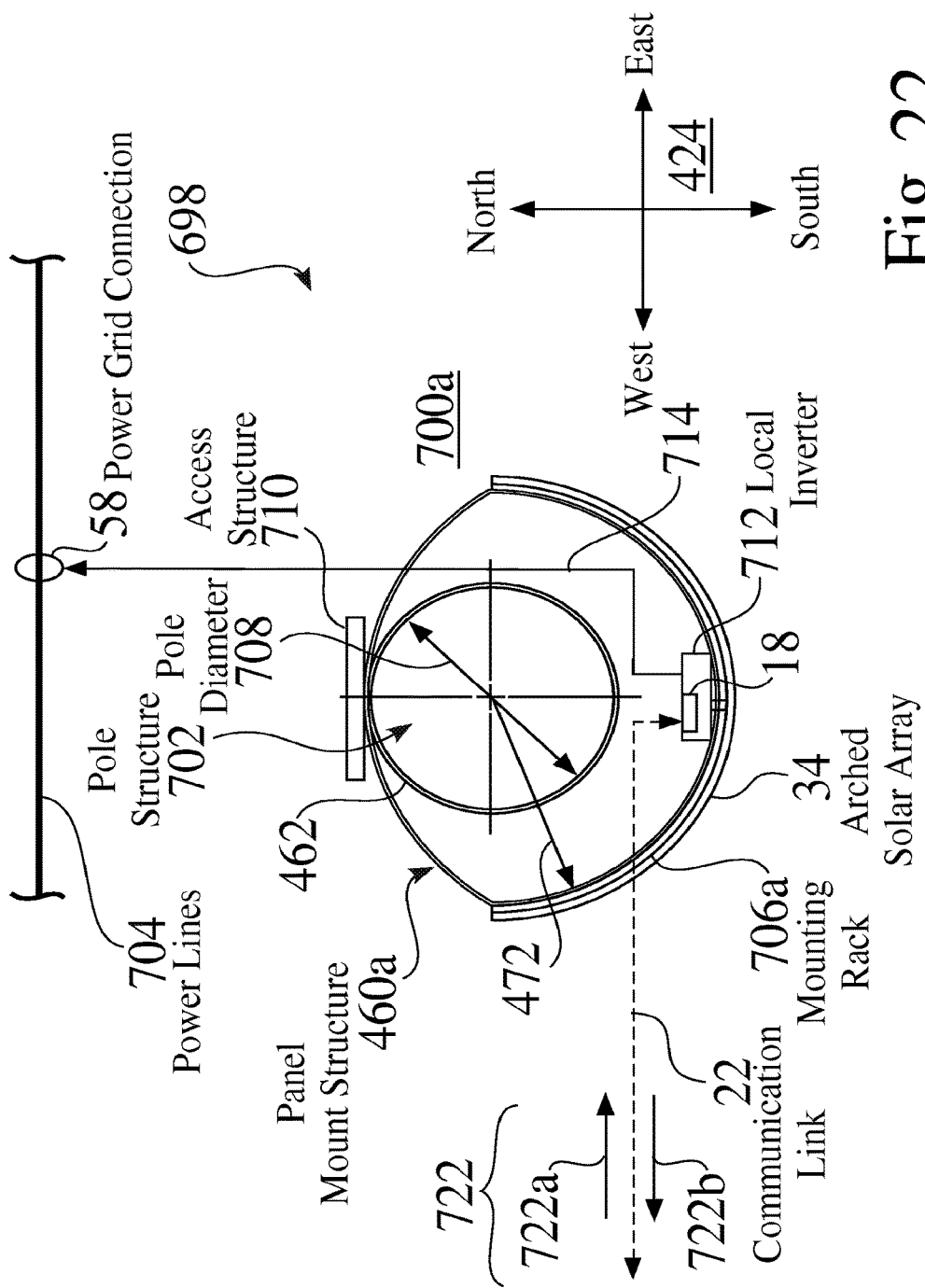
FIG. 22 is a partial schematic view of an exemplary pole-mounted stationary arched solar power structure.
Figure 23:
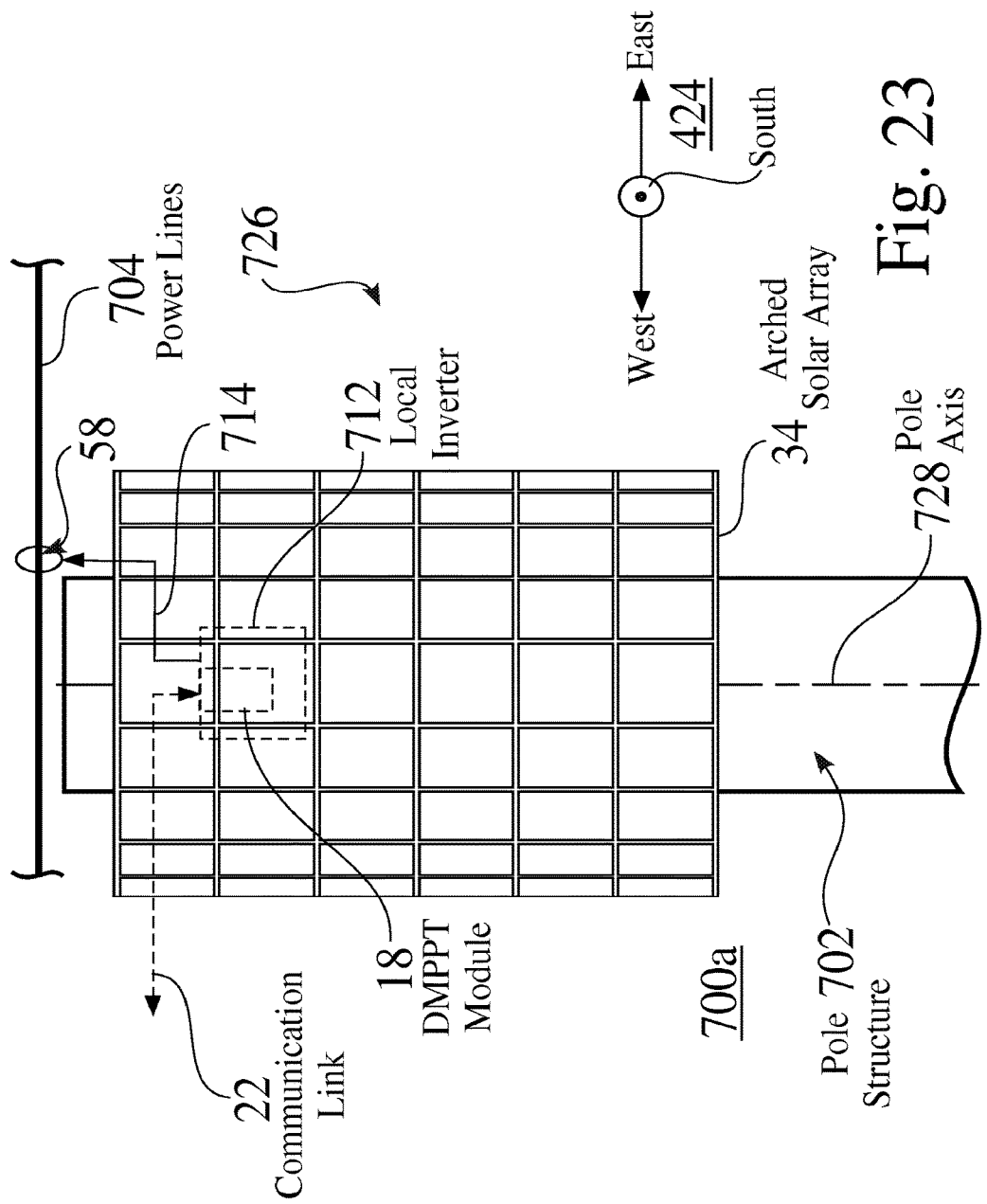
FIG. 23 is a partial front view of an exemplary pole-mounted stationary arched solar power structure.

FIG. 22 is a partial schematic view of an exemplary pole-mounted stationary arched solar power structure 700*a* having local DC to AC inverter 712, e.g. a micro-inverter 712. FIG. 23 is a partial front view 726 of an exemplary pole-mounted stationary arched solar power structure 700*a*. In some exemplary embodiments of pole-mounted stationary arched solar power structures 700, e.g. 700*a*, the solar array 34 comprises at least one solar panel 10, e.g. a flexible 300 watt panel 10, e.g. 36 inches wide by 10 feet long, that is mounted to a curved, e.g. hemispherical, mounting rack 706*a*, having a radius of 12 inches and a length of 10 feet, which is fixedly-mountable to a utility distribution pole 702, i.e. a power pole 702, having a defined characteristic pole axis 728, and an exemplary diameter 708 of 10 inches.

In a current exemplary embodiment of the pole-mounted stationary arched solar power structure 700*a*, the solar array 34 comprises a flexible thin-film panel 10, Part No. SFX-i200, available through Solopower, Inc. of San Jose, Calif., wherein the 200 watt thin-film panel has a width of 0.88 meters, a length of 2.98 meters.

In the Northern hemisphere, the exemplary pole-mounted stationary arched solar power structure 700*a* may typically be mounted facing southward, to maximize local power production. The exemplary pole-mounted stationary arched solar power structure 700*a* seen in FIG. 22 and FIG. 23 extends from and wraps around the power pole 702, wherein the solar array 34 may define and arc up to approximately one hundred eighty degrees. The pole-mounted structure 700*a* may preferably provide a vertical plane for the solar panel array 34, wherein the solar panels 10 are self-cleaning, since less dirt accumulates on the vertical panel surface 435 (FIG. 1), and at least a portion of any accumulated dirt is cleaned through any of wind, rain, dew, or fog. Furthermore the outer surface 435 of the flexible solar panels 10 may further comprise an outer coating layer 438 (FIG. 1), to further prevent buildup of dirt and/or promote cleaning.

The flexible solar array 34, comprising one or more solar panels 10, is mountably supported to a mounting rack 706, e.g. 706*a*, which may preferably be comprised of any of polyethylene or polycarbonate. The mounting rack 706*a* may preferably be attached directly or indirectly to one or more pole mount structures 460, e.g. 460*a*, which are mountable to a pole structure 702 or to other stationary object. An access structure 710 may also be provided, such as on the north side of the pole structure 702, e.g. a utility distribution pole 702, whereby service personnel can access the solar panel structure 700, as well as neighboring power lines 704, phone lines, and/or other items.

The exemplary pole-mounted stationary arched solar power structure 700*a* seen in FIG. 22 and FIG. 23 also comprises a local DC to AC inverter 712, e.g. a micro-inverter 712, for inversion of array DC power to AC power, for AC electrical connection 714 to the local power grid 58.

The DC to AC inverter 712 may be selected based on a wide variety of features, such as but not limited to any of input panel power (nameplate STC), maximum input voltage, peak power tracking voltage, maximum short circuit current, maximum input current, maximum output power, nominal output current, nominal and extended output voltage and range, nominal and extended frequency and range, power factor, nominal efficiency, nominal power point tracking accuracy, temperature range, standby power consumption, size, weight, environmental rating, communications capabilities, and/or warranty. In some system embodiments 700, e.g. 700*a*, the DC to AC inverter 712 may comprise a Model No. M215 micro inverter, available through Enchase Energy, of Petaluma, Calif.

A communication link 22, e.g. wired or wireless, is preferably connectable to the DC to AC inverter 712. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

Each of the pole-mounted stationary arched solar power structures 700*a* typically comprises a mechanism for transmission and receipt of signals 722, for tracking and/or local control of voltage and/or current delivered to the power lines 704 through the DC to AC inverter 712. The DC to AC inverter 712 may also preferably be configured for any of local or off-site control of start-up, daily shutdown, fail safe/emergency shutdown, and/or maintenance modes of operation.

Some embodiments of the DC to AC inverter 712 may further be configured to provide controlled rotation 734 or other movement of one or more solar panels 10 in pole-mounted rotatable solar power structures 700, e.g. 700b (FIG. 24), such as based on location, time of day, date, shading, maximum illumination direction, and/or service modes. e.g. shutting down a panel and locking in position to provide for worker access to a utility distribution pole 702.

Outgoing signals 722b over the communication link 22 are typically sent to a controller or server, associated with the operating entity, e.g. such as but not limited to a local or regional utility, which may provide control through a regional location or through a central location, e.g. headquarters. The signals 722 may be transferred over a network, such as but not limited to the Internet or a cloud network.

Pole-Mounted Rotatable Arched Solar Power Structures.

FIG. 24 is a partial schematic view 730 of an exemplary pole-mounted rotatable arched solar power structure 700b having a local DC to AC inverter 712. FIG. 25 is a partial front view 740 of an exemplary pole-mounted rotatable arched solar power structure 700b. FIG. 26 is a partial schematic view 742 of an exemplary pole-mounted rotatable arched solar power structure 700b, located in the Northern Hemisphere at a first time $T_1$, e.g. early morning, wherein the solar array 34 is rotatably positioned 743a in a generally Eastward direction. FIG. 27 is a partial schematic view 744 of the pole-mounted rotatable arched solar power structure 700b of FIG. 26, at a second time $T_2$, e.g. about 12:00 PM, wherein the solar array 34 is rotatably positioned 743n in a generally Southward direction. FIG. 28 is a partial schematic view 746 of the pole-mounted rotatable arched solar power structure 700b of FIG. 26 and FIG. 27, at a third time $T_3$, wherein the solar array 34 is rotatably positioned 743s in a generally Westward direction.

While the sequential views of the exemplary pole-mounted rotatable arched solar power structure 700b shown in FIG. 26 to FIG. 28 indicate three discreet times during the day, it should be understood that the panel rotation mechanism 732, may preferably be operated 734 continuously or sequentially throughout the day, e.g. such as but not limited to every minute, every ten minutes, or every hour. At the end of the day, such as during system shutdown, during the night, or during start up the next morning, the rotatable solar array 34 is rotated 734 back to its beginning morning position, e.g. 743a.

The exemplary pole-mounted rotatable arched solar power structure 700b seen in FIG. 24 through FIG. 28 may preferably comprise the same mounting rack 706a as the pole-mounted stationary arched solar power structure 700a seen in FIG. 22 and FIG. 23. However, the rotatable arched solar power structure 700b is rotatably movable 734 about the utility distribution pole 702, such as with respect to concentric bearings 736 (FIG. 24) mounted between the inner mount structure 462 and the pole 702. In some embodiments, the solar array 34 is controllably rotatable 734 up to 180 degrees, e.g. up to 90 degrees clockwise or counterclockwise from a central Southward position about the utility distribution pole 702, from east in the AM to west in the PM, under computer control. The solar panel mounting structure 460a may preferably include one or more tracks or guides 736, e.g. roller bearing guide assemblies, wherein the rotatable solar array mounting rack 460a may be rotated 734 about the central pole 702.

In some exemplary embodiments of the pole-mounted rotatable arched solar power structure 700b, the solar array 34 comprises a flexible 300 watt panel, e.g. 36 inches wide by 10 feet long, that is mounted to a curved, e.g. hemispherical, solar array rack 706a, having a radius of 12 inches and a length of 10 feet, which is rotatably mountable to a central support structure, which in turn is mounted to a utility distribution pole 702, i.e. power pole 702, having an exemplary diameter of 10 inches.

The circumference of the exemplary arched solar array 34 in the above example is about 37.7 inches, as compared to a circumference of about 15.7 inches around half of the utility distribution pole 702 having a diameter of 10 inches. In both planar and curved embodiments of the pole-mounted rotatable arched solar power structures 700, the width of the solar arrays 34 may preferably be configured to greater than half the circumference of the power distribution structures, e.g. poles or towers 702, upon which they are installed, since the solar arrays 34 are extendably mounted, i.e. cantilevered out, from the pole structures 702.

Therefore, pole-mounted stationary and rotatable arched solar power structures 700a,700b may readily provide a substantially larger area for solar cells 12, as compared to systems having stationary thin film panels that are wrapped directly to a utility distribution poles 702. The size of the perimeter or diameter of the mounting rack 706a for pole-mounted stationary and rotatable arched solar power structures 700a,700b may be chosen based on one or more factors, such as but not limited to any of available panel sizes, cost, zoning, wind, shading, and/or the rotational range of the system, e.g. 180 degrees, 150 degrees, 120 degrees, etc.

In the Northern hemisphere, the exemplary pole-mounted rotatable arched solar power structure 700b may preferably be rotatable 734 to face from the East to the West, toward the Equator, to maximize local power production.

The exemplary pole-mounted rotatable arched solar power structure 700b seen in FIG. 24 and FIG. 28 may preferably extend around the power pole by up to 180 degrees, and is typically configured to provide a vertical plane for the solar array 34, comprising one or more solar panels 10, wherein the solar panels 10 are self-cleaning, since less dirt accumulates on the vertical panel surfaces 435 (FIG. 1), and at least a portion of any accumulated dirt is cleaned through any of wind, rain, dew, or fog. Furthermore the surface 435 of such flexible solar panels 10 may further comprise an outer coating layer 438 (FIG. 1), to further prevent buildup of dirt and/or promote cleaning.

The flexible solar panels 10 are mountably supported to a mounting rack 706a, which may preferably comprise any of polyethylene or polycarbonate, wherein the mounting rack 706a is attached directly or indirectly to one or more pole mount structures 460a, which are rotatably mountable 736 to a pole structure 702 or other stationary object. An access structure 710, e.g. a service ladder, may also be provided, such as on the north side of the pole 702, wherein service personnel can access the solar panel structure 700b, as well as neighboring power lines 704, phone lines, and/or other items.

While the exemplary pole-mounted rotatable arched solar power structure 700b seen in FIG. 24 through FIG. 28 shows a flexible solar array 34 that is curved and supported in a fixed arc, e.g. having a 24 inch diameter, wherein the array 34 and mounting rack 706a are rotatable 734 as an assembly, an alternate system embodiment 700b may preferably comprise a flexible array 34 that is controllably moved in relation to one or more tracks having a defined arc, such as a movable screen, curtain, or a "Lazy Susan" style track system.

The exemplary pole-mounted rotatable arched solar power structure 700b seen in FIG. 24 through FIG. 28 also comprises a local DC to AC inverter 712, e.g. a micro-inverter 712, for inversion of array DC power to AC power, and for an AC electrical connection 714 to the local power grid 58. The DC to AC inverter 712 for pole-mounted rotatable arched solar power structures 700 may preferably be selected based on a wide variety of features, such as but not limited to any of input panel power (nameplate STC), maximum input voltage, peak power tracking voltage, maximum short circuit current, maximum input current, maximum output power, nominal output current, nominal and extended output voltage and range, nominal and extended frequency and range, power factor, nominal efficiency, nominal power point tracking accuracy, temperature range, standby power consumption, size, weight, environmental rating, communications capabilities, and/or warranty. In some system embodiments 700, e.g. 700b, the DC to AC inverter 712 comprises a Model No. M215 micro inverter, available through Enchase Energy, of Petaluma, Calif.

A communication link 22, e.g. wired or wireless, is preferably connectable to the DC to AC inverter 712. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

The local DC to AC inverter 712, e.g. a micro-inverter 712, may preferably be configured, for the receipt and transmission of signals 722, e.g. 722a,722b, such as for tracking and/or local control of voltage and/or current delivered to the power lines 704 through the DC to AC inverter 712. The local DC to AC inverter 712 may be configured for any of local or off-site control of start-up, daily shutdown, fail safe/emergency shutdown, and/or maintenance modes of operation. A controller such as in conjunction with or within the DC to AC inverter 712, may comprise a mechanism 732 for rotation 734 or other movement of one or more solar panels 10, such as based on location, time, shading, maximum illumination direction, and/or service modes. e.g. shutting down an array 34 or panel 10, and locking in position to provide for worker access to a utility distribution pole 702.

Outgoing signals 722b over the communication link 22 are typically sent to a controller or server, e.g. 153, e.g. associated with the operating entity, such as but not limited to a local or regional utility, which may provide control through a regional location or through a central location, e.g. headquarters. The signals 722 may be transferred over a network 158, such as but not limited to the Internet or a cloud network.

The enhanced pole-mounted solar power structures 700 disclosed herein provide a localized DC to AC inverter 712, e.g. a micro-inverter 712, and localized AC connections 714 to the power lines 704, e.g. right at or near the utility distribution pole 702. Therefore, there are no transmission costs or losses associated with the power produced at the enhanced pole-mounted solar power structures 700.

Pole-Mounted Stationary Flat Solar Power Structures.

Figure 29:
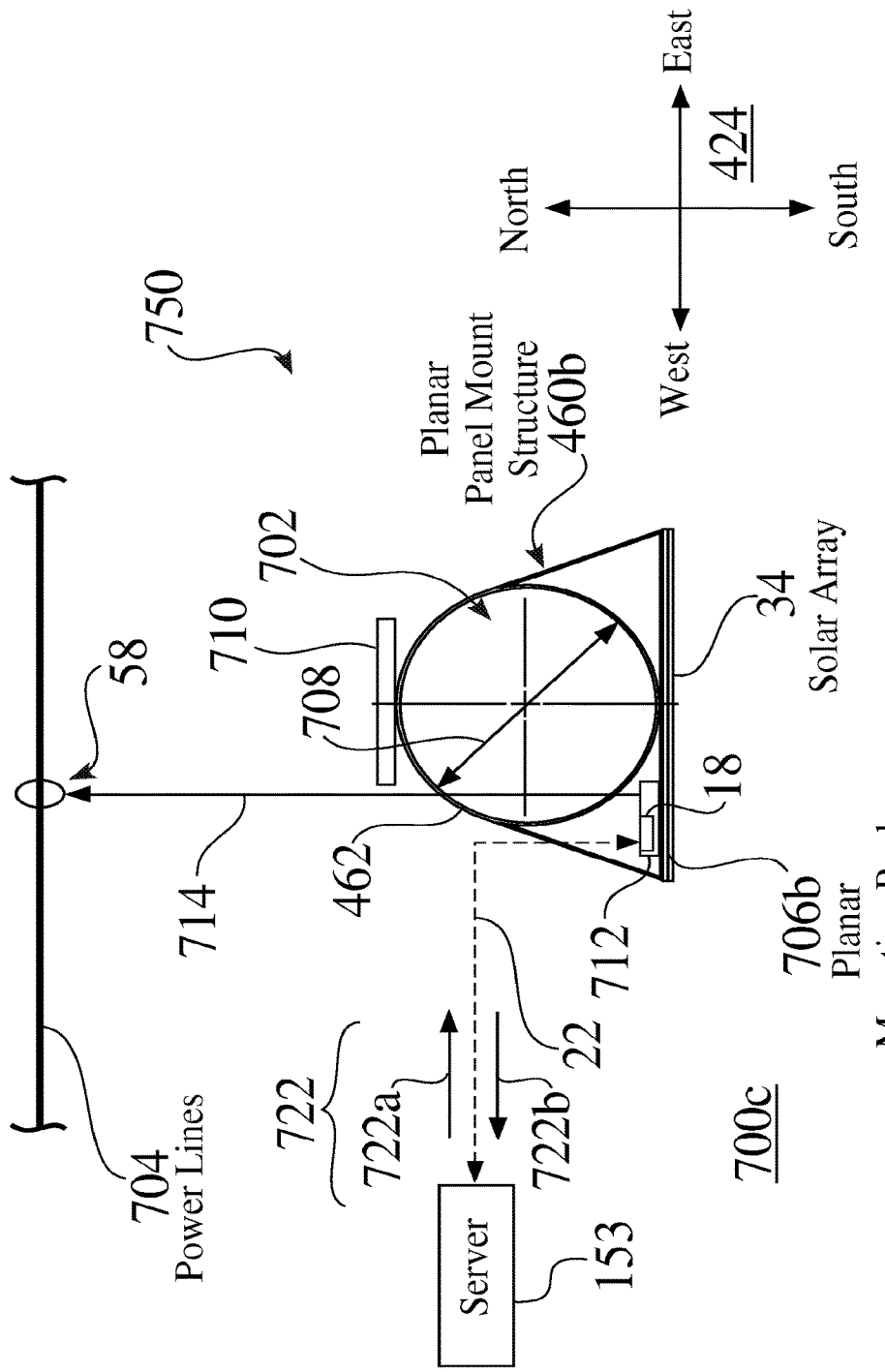
FIG. 29 is a partial schematic view of an exemplary pole-mounted stationary flat solar power structure.
Figure 30:
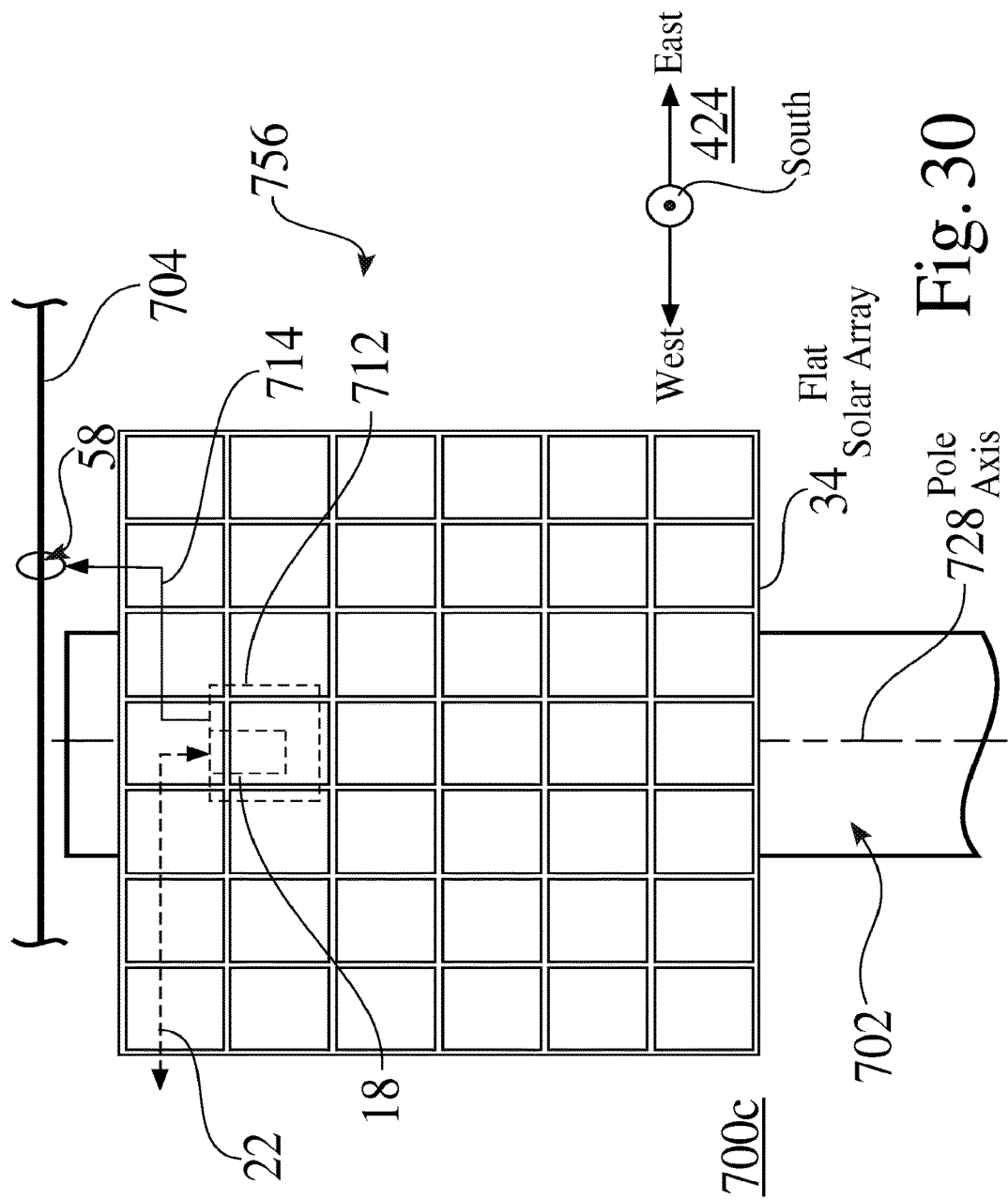
FIG. 30 is a partial front view of an exemplary pole-mounted stationary flat solar power structure.

FIG. 29 is a partial schematic view 750 of an exemplary pole-mounted stationary planar solar power structure 700c. FIG. 30 is a partial front view 756 of an exemplary pole-mounted stationary planar solar power structure 700c.

In some exemplary embodiments of the pole-mounted stationary planar solar power structure 700c, the solar array 34 comprises a flexible rectangular 300 watt panel 10, e.g. having a width 28 (FIG. 2) of 36 inches and a length 29 (FIG. 2) of 10 feet, which is mounted to a planar mounting rack 706b, having a corresponding width of 36 inches and length of 10 feet, wherein the planar mounting rack 706b is fixedly-mountable to a utility distribution pole 702, i.e. power pole 702, having an exemplary diameter 708 of 10 inches. In another current exemplary embodiment of the pole-mounted stationary arched solar power structure 700c, the solar array 34 comprises Part No. SFX-i200 solar panel, available through Solopower, Inc. of San Jose, Calif., wherein the 200 watt thin-film panel 10 has a width 28 of 0.88 meters, and a length 29 of 2.98 meters.

In the Northern hemisphere, the exemplary pole-mounted stationary planar solar power structure 700c may preferably be mounted facing southward, to maximize the local power production. The power production for an exemplary pole-mounted stationary planar solar power structure 700c, such as having a 20" wide by 10' long thin-film panel 10 producing 200 watts mounted to a 20" by 10' rack facing South, is greater than the power production of a pole-mounted stationary solar power structure 700a having a 180 degree curved mounting 706a that is similarly oriented, since the average incident light energy is greater for the flat configuration.

The exemplary pole-mounted stationary planar solar power structure 700c seen in FIG. 29 and FIG. 30 is typically configured to provide a vertical plane for the solar array 34, comprising one or more solar panels 10, wherein the solar panels 10 are inherently self-cleaning, since less dirt accumulates on the vertical panel surfaces 435 (FIG. 1), and at least a portion of any accumulated dirt is cleaned through any of wind, rain, dew, or fog. The outer surfaces 435 of the flexible solar panels 10 may also comprise an outer coating layer 438 (FIG. 1), to further prevent buildup of dirt and/or promote cleaning.

The flexible solar array 34 is mountably supported to a planar mounting rack 706b, which may preferably comprise any of polyethylene or polycarbonate, wherein the planar mounting rack 706b is attached directly or indirectly to one or more planar panel mount structures 460b, which are mountable to pole structure 702 or other stationary object. An access structure 710, e.g. a ladder, may also be provided, such as on the North side of the pole structure 702, wherein service personnel can access the solar panel structure 700c, as well as any of neighboring power lines 704, phone lines, or other items.

The exemplary pole-mounted stationary planar solar power structure 700c seen in FIG. 29 and FIG. 30 similarly comprises a local DC to AC inverter 712, e.g. a micro-inverter 712, for inversion of array DC power to AC power, and for AC electrical connection 714 to the local power grid 58. A DMPPT module 18 may also be provided, such as within or otherwise associated with the DC to AC inverter 712.

A communication link 22, e.g. wired or wireless, is preferably connectable to the micro-inverter 712. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

The local DC to AC inverter 712, e.g. a micro-inverter 712, may preferably be configured, for the receipt and transmission of signals 722, e.g. for tracking and/or local control of voltage and/or current delivered to the power lines 704 through the DC to AC inverter 712. The local DC to AC inverter 712 may be configured for any of local or off-site control of start-up, daily shutdown, fail safe/emergency shutdown, and/or maintenance modes of operation.

Outgoing signals 722b over the communication link 22 may preferably be sent to a controller or server, e.g. 153, such as associated with the operating entity, e.g. such as but not limited to a local or regional utility, which may provide control through a regional location or through a central location, e.g. headquarters. The outgoing, i.e. uplink, signals 922b may be transferred over a network, such as but not limited to the Internet or a cloud network.

Pole-Mounted Rotatable Flat Solar Power Structures.

Figure 31:
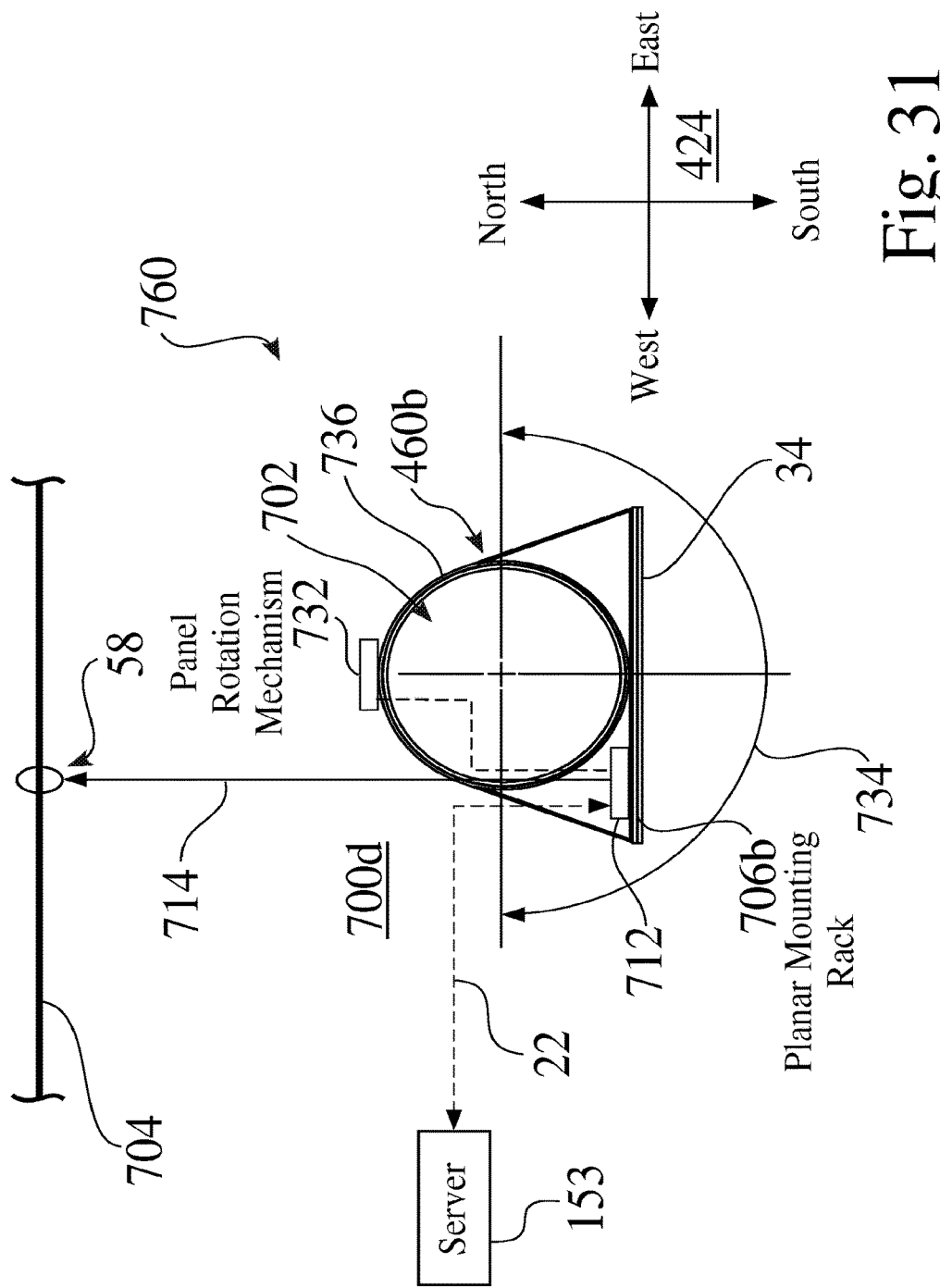
FIG. 31 is a partial schematic view of an exemplary pole-mounted rotatable flat solar power structure.

FIG. 31 is a partial schematic view 760 of an exemplary pole-mounted rotatable planar solar power structure 700d. FIG. 32 is a partial schematic view 762 of an exemplary pole-mounted rotatable planar solar power structure 700d, located in the Northern Hemisphere at a first time $T_1$, e.g. early morning, wherein the solar array 34 is rotatably positioned 734 in a generally Eastward direction 743a. FIG. 33 is a partial schematic view 764 of the pole-mounted rotatable planar solar power structure 700d of FIG. 32, at a second time $T_2$, e.g. midday, wherein the solar array 34 is rotatably positioned 734 in a generally Southward direction 743n. FIG. 34 is a partial schematic view 766 of the pole-mounted rotatable planar solar power structure 700d of FIG. 32 and FIG. 33, at a third time $T_3$, e.g. just before dusk, wherein the solar array 34 is rotatably positioned 734 in a generally Westward direction 743s.

The rotatable planar solar power structure 700d seen in FIG. 31 through FIG. 34 may be similar in mounting 460b to the stationary planar solar power structure 700c seen in FIG. 29 and FIG. 30, except for the use of tracks or guides 736, e.g. roller bearing guides, that allow the mounting rack 706b and corresponding solar array 34 to rotate 734, e.g. up to 180 degrees, around the power pole 702. In some system embodiments, the mounting rack 706b and corresponding solar array 34 may preferably be rotated based on any of location, time of day, available light, shading, service needs, startup, shutdown, or any combination thereof. For example, the mounting rack 706b and corresponding solar array 34 may be controllably rotated 734, e.g. clockwise in the Northern hemisphere) from the east in the morning toward the west in the afternoon, such as responsive to any of local or remote computer control.

Transmission Line Mounted Solar Power Structures.

Figure 35:
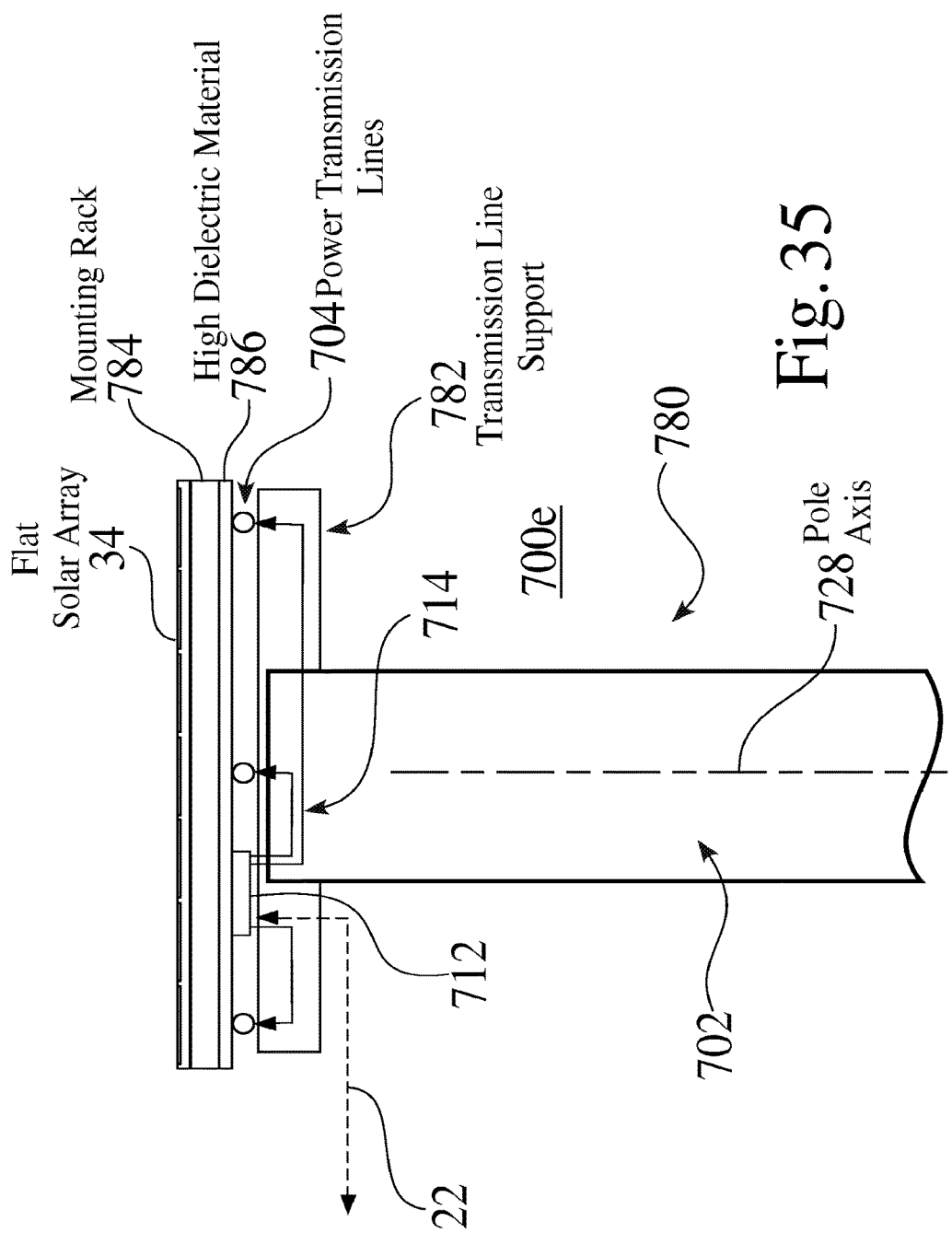
FIG. 35 is a partial schematic view of a transmission line mounted solar power structure.

FIG. 35 is a partial schematic view 780 of a transmission line mounted solar power structure 700e. In one exemplary embodiment, the solar array comprises a 36" wide by 10' long thin-film solar panel 10 that is mounted, with or without a mounting rack 784, flat on top of three power transmission lines 704. The solar panel 10 and mounting rack 784 may preferably be centered and locked onto the top of the power pole 702, such as with 5' overhang left and right of the power pole 702, with the solar panel 10 attached to the power lines 704 for support, and separated from the power lines 704 with a high dielectric material 786. A local DC to AC inverter 712, e.g. a micro inverter 712, is connected to the DC outputs of the solar array 34. The DC to AC inverter 712 also provides a local AC connection 714 to the local power grid 58, through the power transmission lines 704.

Pole Mounted Solar Concentrator Structures.

FIG. 36 is a partial schematic view 800 of an exemplary pole-mounted arched solar concentrating power structure 700f. FIG. 37 is a partial schematic view 820 of an exemplary pole-mounted planar solar concentrating power structure 700g.

In an exemplary embodiment of the pole-mounted solar concentrating power structures 700f,700g, a 24 inch wide by 10 foot long solar concentrating panel 804, e.g. heliostat technology, is mounted to a corresponding mounting rack 706, e.g. 706a,706b, and may further comprise roller bearing guides 736 and a rotation mechanism 732, e.g. a drive motor 732, which allows the solar concentrating panels 804 to be controllably rotated 734 around the power pole 702, e.g. up to 180 degrees, from east in the morning to west in the afternoon, such as responsive to any of local or remote computer control. The use of heliostat technology, as applied to one or more of the embodiments 700f,700g, although more complex, may suitably be implemented to provide more electricity than an installation without such heliostat mechanisms, e.g. up to an approximate factor of five times over array embodiments without solar power concentration.

Pole Mounted Solar Power Structures Integrated with Wind Generation Systems.

Figures 38, 39:
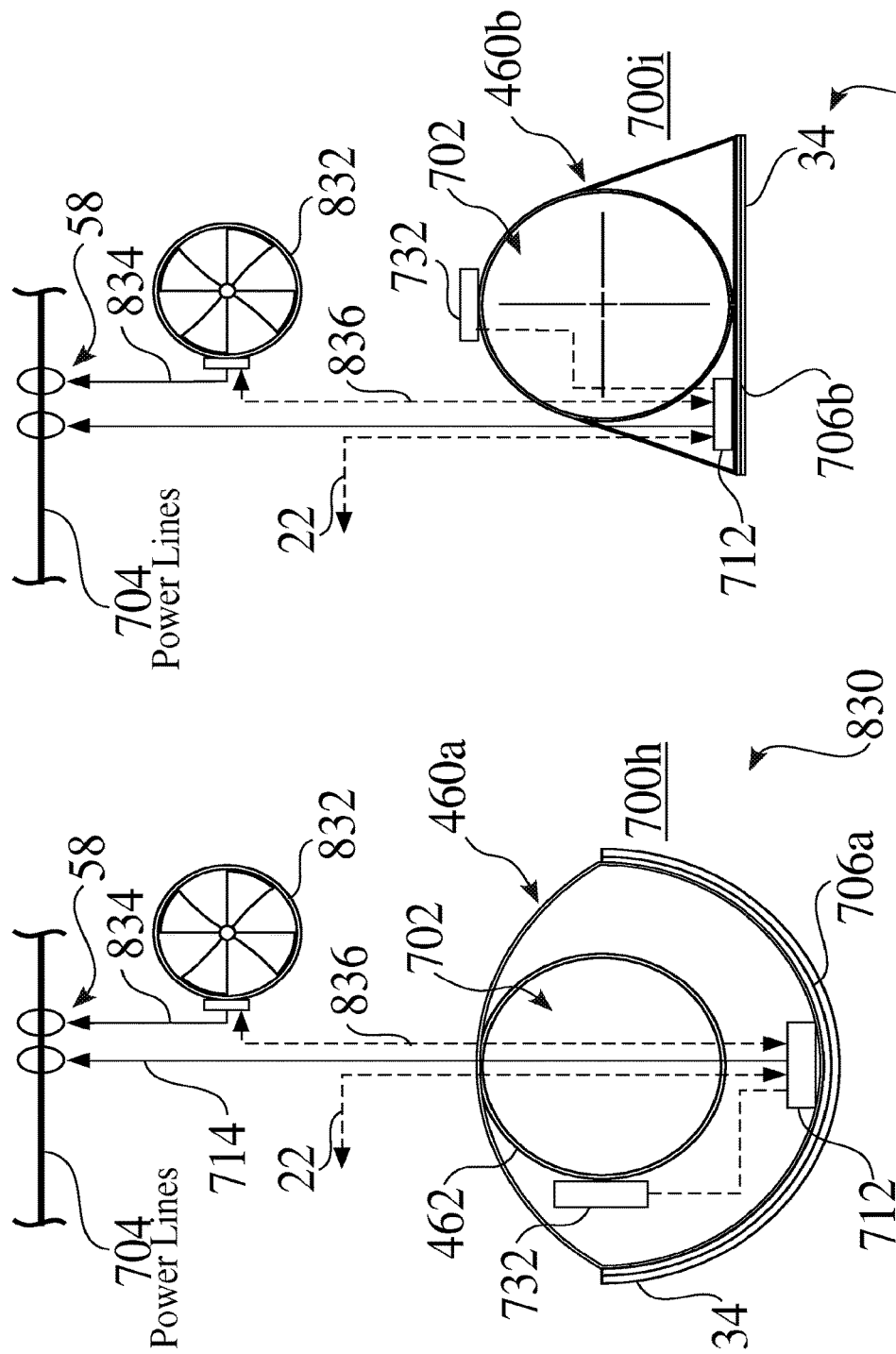
FIG. 38 is a partial schematic view of an exemplary pole-mounted arched solar power structure that is integrated with a wind turbine.
FIG. 39 is a partial schematic view of an exemplary pole-mounted flat solar power structure that is integrated with a wind turbine.

FIG. 38 is a partial schematic view 830 of an exemplary pole-mounted arched solar power structure 700h, which is integrated with a wind turbine 832. FIG. 39 is a partial schematic view 840 of an exemplary pole-mounted planar solar power structure 700i, which is integrated with a wind turbine 832.

In such combined solar and wind power generation systems 700h, 700i, a wind turbine 832 may preferably be mounted to the north side of the power pole 702, so as not to interfere with a thin-film solar array 34 mounted to the south side of the pole 702. Depending on the solar array width 28 and length 29, the combined solar and wind power generation systems 732h, 731i may produce more energy at a given location, in areas that have sufficient wind speed and duration, as compared to a pole-mounted system 700 that provides only solar power. As well, since the duty cycles of the solar power system and the wind power system are not identical, the power generation from one may be used to provide power to the other, such as during start up or for troubleshooting.

Exemplary System Operation.

Figure 40:
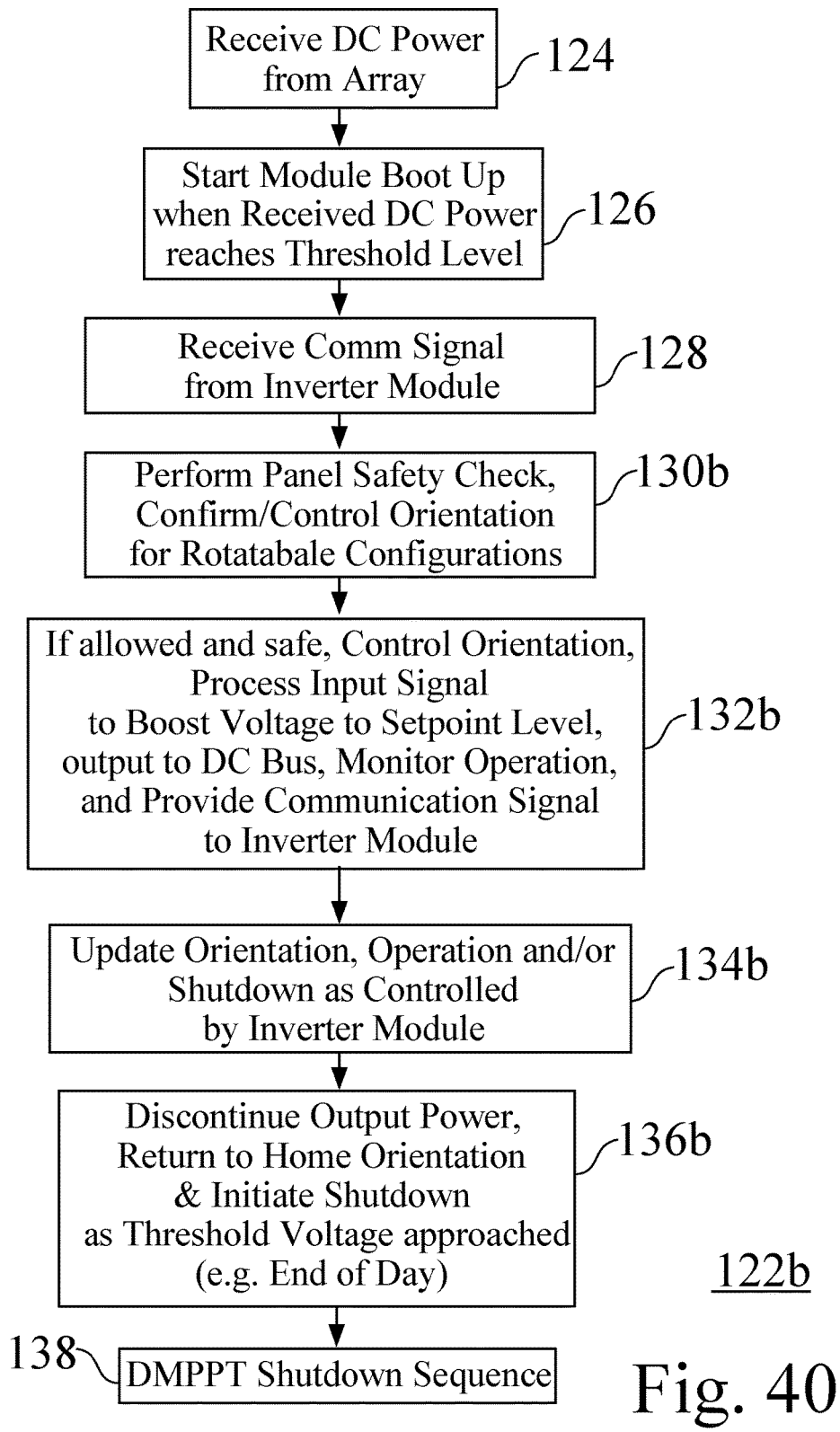
FIG. 40 is a flowchart of an exemplary operation of a pole mounted rotatable power module.

FIG. 40 is a flowchart of an exemplary process 122b for operation of an enhanced pole-mounted solar power structure 700. As a solar array 34 starts producing a voltage 102 and current 104 when light is shining on it, once the voltage 102 reaches a threshold voltage 116, e.g. approximately 4.5 to 6.5 Volts DC, the DC to AC inverter 712 automatically wakes up 126, and starts performing the necessary checks 128,130b, before switching over to RUN Mode 132b. For rotatable system embodiments 700, e.g. 700b,700d,700j (FIG. 41), the position 743, e.g. 743a-743s (FIGS. 26-28) and rotation 734 of the rotatable solar array 34 may be monitored, and/or controlled.

As the voltage 102 of the solar panel 10 increases, the micro-inverter 712 starts boosting the voltage 102 from the solar array 34 to the local distribution bus 42 feeding the local micro-inverter 712. This wait is necessary to prevent the loss of control power from the controller circuit 70 (FIG. 7) when switching begins. By using control inputs, the system tracks the maximum power point of the solar array 34, and boosts the voltage out to the local DC Bus 42 feeding the local DC to AC inverter 712, e.g. a micro-inverter 712. Since the voltage 102i is boosted 102o, the system as a whole reaches striking voltage for the local DC to AC inverter 712 in a shorter period than a conventional array of panels 10 would without DMPPT functionality.

As seen at step 134*b*, the process 122*b* may controllably updated any of orientation, operation, or initiate shutdown, such as controlled by the DC to AC inverter 712. As seen at step 136*b*, such as during shutdown at the end of the day, the process 122*b* may discontinue output power, return to a home orientation for rotatable system embodiments 700, and initiate shutdown 138 as a threshold voltage is reached.

The local DC to AC inverter 712 address many of the current limitations of solar power by providing "Early-On" and "Late-Off" for extended harvest times. Since the output from the solar panels 10 is boosted, the usable power is converted by the local DC to AC inverter 712, because the striking voltage is reached sooner and can be held longer, thereby resulting in an increase in harvestable power from each of the solar panels 10.

As well, some embodiments of the local DC to AC inverters 712 and/or DMPPT modules 18 may preferably be reprogrammable or updatable, such as over the communications link 22, wherein different algorithms may be sent and stored within the controllers 80, such as for modifying start up, operation, safety and shutdown operations.

The local DC to AC inverters 712 also help to reduce the effects of partial shading on solar panels 10 in arrays 34. In conventional solar panels, partial shading of a single cell 12 causes the entire panel and string in which it is connected to reduce power output, and also increases loses due to string mismatch, by lowering the MPPT point for an entire solar array. In contrast to conventional panels, the local DC to AC inverters 712 and/or DMPPT modules 18 can controllably compensate for partial shading at the panel level, to boost the DC output signal 102*o*.

The use of local DC to AC inverters 712 with different embodiments of enhanced pole-mounted systems 700 provide many advantages over prior technologies. For example, the local DC to AC inverter 712 can readily be used to boost the DC performance of a pole mounted structure 700, and can readily be controlled, either through the communication link 22, or locally, e.g. by service personnel, to shut down the associated array 34. For solar panels 10 and/or arrays 34 that may preferably track production of one or more cells 12 on a panel 10, e.g. a column, the local DC to AC inverter 712 may be used to locally monitor energy production as a function of column, such as to provide a local set point for rotating the solar array 34 to center itself toward a direction of maximum power harvest.

It should be understood that the pole mounted structures 700 and methods for their use may be implemented for systems that do not include DMPPT modules 18. As well, local DC to AC inverters 712 and the methods for their use may be implemented for a wide variety of power generation systems and structures.

Furthermore, while some of the embodiments of pole-mounted solar power structures 700 are described herein as comprising a single flexible solar panel 10 that is fixed or rotatably controllable, it should be understood that the pole mounted structures 700 and methods for their use may be implemented for systems that comprise a plurality of solar panels 10, such as for but not limited to available panel geometry, and/or providing wind gaps defined between neighboring panels 10.

In addition, while some of the embodiments of pole-mounted solar power structures 700 are described herein as comprising a track or guides 736 for rotating solar panel assemblies 706, it should be understood that the pole mounted structures 700 and methods for their use may be rotated using a wide variety of mechanisms, such as structures for relative movement or rotation about the inner diameter of a mounting pole 702, structures for relative movement of the solar panels in relation to an outer defined arch, and/or any other mechanism for relative rotation for one or more solar panels 10 with respect to a fixed utility structure.

Figure 41:
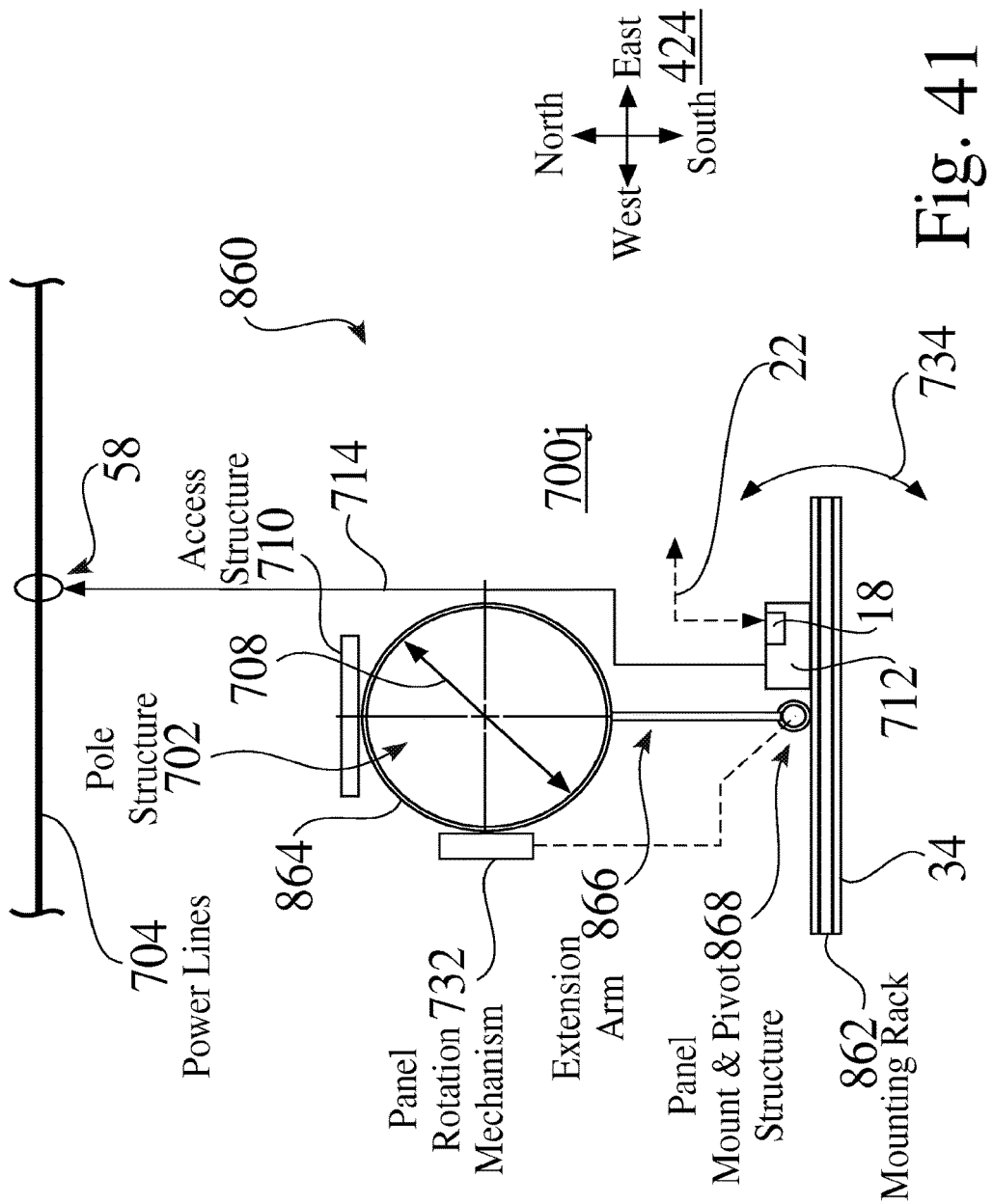
FIG. 41 is a partial schematic view of an exemplary pole-mounted solar power structure having an extended pivot structure.

For example, FIG. 41 is a partial schematic view 860 of an exemplary pole-mounted solar power structure 700*j* having an extended pivot structure 864,866. The structure 700*j* may in some embodiments be stationary, or in other embodiments, be rotatable 734 about a pivot structure 868 that extends 866, such as from a pole mount 864. The exemplary structure seen in FIG. 41 is therefore non-concentric to the pole 702 from which it extends. In some embodiments, the panel rotation mechanism 732 may operate directly upon an axis 925 (FIG. 46) associated with the solar panel support structure. While the exemplary DC to AC inverter 712, e.g. a micro-inerter 712, shown in the embodiment of FIG. 41 is generally located upon the solar panels structure, it should be understood that the DC to AC inverter 712 and/or DMPPT 18, in this or other system embodiments 700, may be located at other locations, as desired, such as but not limited to being affixed to any of another portion of the mounting structure 864 or mounting rack 862, to the power pole 702 itself, or to other associated equipment or structures.

FIG. 42 is a partial bird's eye schematic view 870 of an exemplary pole-mounted rotatable planar solar power structure 700*j*, located in the Northern Hemisphere at a first time $T_1$, wherein the solar array 34 is rotatably positioned 734 in a generally Eastward direction 743*a*. FIG. 43 is a partial bird's eye schematic view 880 of the pole-mounted rotatable planar solar power structure 700*j* of FIG. 42 at a second time $T_2$, wherein the solar array 34 is rotatably positioned 734 in a generally Southward direction 743*n*. FIG. 44 is a partial bird's eye schematic view 890 of the pole-mounted rotatable planar solar power structure 700*j* of FIG. 42 and FIG. 43 at a third time $T_3$, wherein the solar array 34 is rotatably positioned 734 in a generally Westward direction 743*s*. As seen in FIG. 42 to FIG. 44, the length of the extension arms 866 may preferably be greater than half the width of the solar array 34, such as to allow at least 180 degrees of rotation 734 and, depending on the system configuration, may be configured to allow full rotation 734 of the solar array 34, e.g. clockwise rotation and/or counterclockwise rotation.

FIG. 45 is a side schematic view 900 of the pole-mounted rotatable planar solar power structure 700*j* of FIG. 42, wherein the solar array 34 is rotatably positioned 734 in a generally Eastward direction 743*a*. FIG. 46 is a side schematic view 910 of the pole-mounted rotatable planar solar power structure 700*j* corresponding to FIG. 43, wherein the solar array 34 is rotatably positioned 734 in a generally Southward direction 743*n*. FIG. 47 is a side schematic view 920 of the pole-mounted rotatable planar solar power structure 700*j* corresponding to FIG. 44, wherein the solar array 34 is rotatably positioned 734 in a generally Westward direction 743*s*. The exemplary pole-mounted rotatable flat solar power structure 700*j* seen in FIG. 41 to FIG. 47 may preferably allow full rotation 734, e.g. clockwise rotation, such as throughout the day during power production, and similarly, to return to a starting position, 743, e.g. 743*a*.

While the exemplary pole-mounted rotatable planar solar power structure 700*j* seen in FIG. 41 to FIG. 47 is disclosed in regard to a planar solar array 34 and mounting rack 862, it should be understood that the power structure 700*j* may readily be implemented with other profiles, such as but not limited to curved or arched solar arrays 34. As well, the curvature in some system embodiments 700, e.g. 700*j* is not limited to being concentric to the pole structure 702. For example, a solar array 34 and corresponding mounting rack 862 may preferably be formed with a substantially gradual curve, i.e. having a large effective radius, such as to effectively collect incoming solar energy, in a similar manner to a planar panel, while providing a more robust mechanical structure, in a similar manner to a curved mounting rack.

Accordingly, although the invention has been described in detail with reference to a particular preferred embodiment, persons possessing ordinary skill in the art to which this invention pertains will appreciate that various modifications and enhancements may be made without departing from the spirit and scope of the disclosed exemplary embodiments.

The invention claimed is:

1. A system, comprising:
 a mounting structure that is configured for attachment to a power distribution structure, wherein the power distribution structure is configured to support alternating current (AC) power transmission lines that are connected to a power grid, wherein the power distribution structure has a defined axis and a defined circumference, and wherein the mounting structure includes a mounting rack that is configured to extend from the power distribution structure;
 a solar array comprising at least one solar panel that is affixed to the mounting rack, and DC outputs extending from the solar array; and
 an DC to AC inverter connected between the DC outputs of the solar array and the AC power transmission lines.

2. The system of claim 1, wherein the solar array has a defined length and width.

3. The system of claim 2, wherein the length of the solar array is generally aligned with the defined axis of the power distribution structure.

4. The system of claim 2, wherein the width of the solar array is greater than half the circumference of the power distribution structure.

5. The system of claim 1, wherein the mounting rack is mountable on top of the AC power transmission lines.

6. The system of claim 5, further comprising:
 a dielectric material for separating the mounting rack and the solar array from the AC power transmission lines.

7. The system of claim 1, wherein the power distribution structure comprises any of a power distribution pole or a power distribution tower.

8. The system of claim 1, wherein the DC to AC inverter further comprises:
 a control module, and
 a communications link connected to the control module;
 wherein the control module comprises:
  input connections that are connected to the solar array,
  output connections that are connected to the DC to AC inverter,
  a signal processing circuit connected to the input connections, and
  a controller that is connected to the signal processing circuit, wherein the controller is connected to any of a computer or a server through the communications link;
 wherein the DC output of the solar array is controllably adjustable in response to an input signal that is sent from the computer or server and received at the controller over the communications link.

9. The system of claim 1, wherein the solar array and at least a portion of the mounting structure are rotatable with respect to the power distribution structure.

10. The system of claim 1, further comprising:
 a rotation mechanism that is configured to rotate the mounting rack and the solar array with respect to the power distribution structure.

11. The system of claim 10, wherein the rotation mechanism is controllably responsive to a signal.

12. The system of claim 10, wherein the rotation mechanism is responsive to any of location, time of day, available light, or any combination thereof.

13. The system of claim 10, wherein the rotation mechanism is configured to rotate the mounting rack and the solar array based on the direction of incident solar energy.

14. The system of claim 1, wherein the mounting rack and the solar array are substantially planar.

15. The system of claim 1, wherein the mounting rack and the solar array are curved.

16. The system of claim 1, wherein the solar array is substantially rigid.

17. The system of claim 1, wherein the solar array is flexible.

18. The system of claim 1, wherein the solar array further comprises at least one heliostat mechanism.

19. The system of claim 1, further comprising:
 a wind turbine mounted to the power distribution structure and connected to the AC power transmission lines.

20. The system of claim 1, further comprising:
 an access structure affixed to the power distribution structure that is configured to provide access to any of the AC power transmission lines, the mounting structure, the solar array, or the DC to AC inverter.

21. A process for locally harvesting solar power, comprising:
 attaching a power generation structure to a power distribution structure that supports alternating current (AC) power transmission lines, wherein the power distribution structure has a defined circumference, and wherein the power generation structure comprises:
  a mounting structure that includes a mounting rack,
  a solar array comprising at least one solar panel that is affixed to the mounting rack, and DC outputs extending from the solar array, and
  a DC to AC inverter connected between the DC outputs of the solar array and the AC power transmission lines;
 wherein the attaching the power generation structure to the power distribution structure comprises attaching the mounting structure to the power distribution structure, such that the mounting structure extends from the power distribution structure;
 collecting solar energy through the solar array;
 inverting the DC power from the solar array to AC power through the DC to AC inverter; and
 transferring the AC power to the AC power transmission lines.

22. The process of claim 21, wherein the solar array has a defined length and width.

23. The process of claim 22, wherein the length of the solar array is generally aligned with the power distribution structure.

24. The process of claim 22, wherein the width of the solar array is greater than half the circumference of the power distribution structure.

25. The process of claim 21, wherein the mounting rack and the solar array are rotatable, and wherein the process further comprises:
 controllably rotating the mounting rack and the solar array.

26. The process of claim 25, wherein the controllably rotating the mounting rack and the solar array is based on any of location, time of day, available light, or any combination thereof.

\* \* \* \* \*